(12) United States Patent
Na et al.

(10) Patent No.: US 11,600,669 B2
(45) Date of Patent: Mar. 7, 2023

(54) ELECTRONIC DEVICE

(71) Applicant: Samsung Display Co., Ltd., Yongin-si (KR)

(72) Inventors: Hye-Seok Na, Hwaseong-si (KR); Younggu Kang, Cheonan-si (KR); Hyun-Sung Park, Hwaseong-si (KR); Dongjin Seo, Hwaseong-si (KR); Yu Deok Seo, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/347,432

(22) Filed: Jun. 14, 2021

(65) Prior Publication Data
US 2022/0020824 A1 Jan. 20, 2022

(30) Foreign Application Priority Data

Jul. 14, 2020 (KR) .................. 10-2020-0087072

(51) Int. Cl.
*H01L 27/32* (2006.01)
*G06F 3/041* (2006.01)
*G06F 3/044* (2006.01)

(52) U.S. Cl.
CPC .......... *H01L 27/323* (2013.01); *G06F 3/0412* (2013.01); *G06F 3/0442* (2019.05); *G06F 3/0443* (2019.05); *G06F 3/0445* (2019.05); *G06F 3/0448* (2019.05); *G06F 2203/04111* (2013.01); *G06F 2203/04112* (2013.01)

(58) Field of Classification Search
CPC . G06F 3/044–0448; G06F 2203/04112; G06F 2203/04111
See application file for complete search history.

(56) References Cited

U.S. PATENT DOCUMENTS 8,773,393 B2 * 7/2014 Cok ...................... G06F 3/0446
345/174
8,819,927 B2 * 9/2014 Cok ...................... G06F 3/0443
29/850

(Continued)

FOREIGN PATENT DOCUMENTS

| KR | 10-1493412 B1 | 2/2015 |
| KR | 10-2015-0074350 A | 7/2015 |
| KR | 10-2016-0022620 A | 3/2016 |

*Primary Examiner* — Patrick F Marinelli
(74) *Attorney, Agent, or Firm* — Lewis Roca Rothgerber Christie LLP

(57) ABSTRACT

An electronic device includes: a display panel configured to display an image; an input sensor on the display panel and comprising a first sensing electrode and a second sensing electrode that is electrically insulated from the first sensing electrode, the input sensor being configured to sense a first input in a first mode and to sense a second input in a second mode; and an input device configured to provide the second input to the input sensor, wherein at least one of the first or second sensing electrodes comprises: a main mesh pattern in a crossing area in which the first and second sensing electrodes cross each other; and a sub mesh pattern in a non-crossing area on which the first and second sensing electrodes do not cross each other and which has a size different from that of the main mesh pattern.

26 Claims, 23 Drawing Sheets

(56) References Cited

U.S. PATENT DOCUMENTS

| | | | |
|---|---|---|---|
| 8,836,668 B2 * | 9/2014 | Cok | G06F 3/0446 345/174 |
| 8,884,918 B2 * | 11/2014 | Cok | G06F 3/0446 345/173 |
| 9,167,688 B2 * | 10/2015 | Lebens | G06F 3/04164 |
| 9,229,563 B2 | 1/2016 | Park | |
| 9,740,311 B1 * | 8/2017 | Omelchuk | G06F 3/0338 |
| 9,851,850 B2 * | 12/2017 | Kim | G06F 3/04166 |
| 10,429,979 B2 * | 10/2019 | Du | G06F 1/1652 |
| 10,579,174 B2 * | 3/2020 | Kim | G09G 3/3225 |
| 10,712,889 B2 * | 7/2020 | Park | G06F 3/0443 |
| 11,023,058 B2 * | 6/2021 | Park | G06F 3/0412 |
| D928,782 S * | 8/2021 | Seo | D14/341 |
| 2010/0044122 A1 * | 2/2010 | Sleeman | H03K 17/9622 178/18.06 |
| 2011/0102370 A1 * | 5/2011 | Kono | H03K 17/9622 200/600 |
| 2013/0161070 A1 * | 6/2013 | Lee | H05K 3/105 174/250 |
| 2013/0219679 A1 * | 8/2013 | Cok | H01G 13/00 29/850 |
| 2013/0222325 A1 * | 8/2013 | Cok | G06F 3/0446 200/600 |
| 2013/0222326 A1 * | 8/2013 | Cok | G06F 3/0445 29/850 |
| 2013/0222327 A1 * | 8/2013 | Cok | G06F 3/0446 345/174 |
| 2013/0222328 A1 * | 8/2013 | Cok | G06F 3/0445 345/174 |
| 2013/0224370 A1 * | 8/2013 | Cok | C23C 18/143 427/108 |
| 2013/0327560 A1 * | 12/2013 | Ichiki | H01B 5/00 174/133 R |
| 2014/0054070 A1 * | 2/2014 | Ichiki | H05K 1/0274 174/253 |
| 2014/0160373 A1 * | 6/2014 | Hsu | G06F 3/0446 430/318 |
| 2015/0177872 A1 * | 6/2015 | Kim | G06F 3/04166 345/174 |
| 2015/0242010 A1 * | 8/2015 | Cok | G06F 3/046 345/174 |
| 2016/0004358 A1 * | 1/2016 | Frey | G06F 3/0445 345/174 |
| 2016/0041649 A1 * | 2/2016 | Uchida | G06F 3/0443 29/846 |
| 2016/0062409 A1 * | 3/2016 | Guard | G06F 3/0412 349/12 |
| 2016/0170524 A1 * | 6/2016 | Kim | G06F 3/0446 345/174 |
| 2016/0224181 A1 * | 8/2016 | Kim | G06F 3/0446 |
| 2016/0266691 A1 * | 9/2016 | Jang | G06F 3/0443 |
| 2016/0282989 A1 * | 9/2016 | Hirakata | G06F 3/0446 |
| 2016/0313836 A1 * | 10/2016 | Cho | G06F 3/0443 |
| 2017/0031490 A1 * | 2/2017 | Hashida | G06F 3/0445 |
| 2017/0147116 A1 * | 5/2017 | Lee | G06F 3/0412 |
| 2017/0185189 A1 * | 6/2017 | Barton | G06F 3/044 |
| 2018/0018042 A1 * | 1/2018 | Shiojiri | G06F 3/0445 |
| 2018/0039360 A1 * | 2/2018 | Akimoto | G06F 3/0446 |
| 2018/0143720 A1 * | 5/2018 | Kim | H01L 51/5253 |
| 2018/0232070 A1 | 8/2018 | Katsurahira | |
| 2018/0314372 A1 * | 11/2018 | Lee | G06F 3/0448 |
| 2018/0373365 A1 * | 12/2018 | Nakamura | G06F 3/0446 |
| 2019/0129568 A1 * | 5/2019 | Sakamoto | G06F 3/04164 |
| 2019/0146611 A1 * | 5/2019 | Park | G06F 3/0412 345/174 |
| 2019/0187846 A1 * | 6/2019 | Du | G06F 3/0412 |
| 2019/0294284 A1 * | 9/2019 | Akimoto | H01L 51/5218 |
| 2020/0026377 A1 * | 1/2020 | Gwon | G06F 3/0443 |
| 2020/0154612 A1 * | 5/2020 | Kuriki | H05K 9/0096 |
| 2020/0192504 A1 * | 6/2020 | Nakamura | G06F 3/0445 |
| 2020/0249791 A1 * | 8/2020 | Kim | G06F 3/0445 |
| 2020/0333912 A1 * | 10/2020 | Na | G06F 3/0446 |
| 2021/0026483 A1 * | 1/2021 | Miyamoto | G06F 3/0446 |
| 2021/0117043 A1 * | 4/2021 | Lee | G06F 3/0445 |
| 2021/0149523 A1 * | 5/2021 | Zhong | G06F 3/0445 |
| 2021/0208710 A1 * | 7/2021 | Han | G06F 3/0446 |
| 2021/0255724 A1 * | 8/2021 | Park | G06F 3/0412 |
| 2021/0278928 A1 * | 9/2021 | Kim | G06F 3/0446 |
| 2021/0357082 A1 * | 11/2021 | Yang | G06F 3/0446 |
| 2021/0397289 A1 * | 12/2021 | Park | G06F 3/0446 |
| 2021/0397298 A1 * | 12/2021 | Choi | G06F 3/0418 |
| 2021/0397300 A1 * | 12/2021 | Yun | G06F 3/0443 |
| 2021/0405816 A1 * | 12/2021 | Niu | G06F 1/1652 |
| 2021/0405818 A1 * | 12/2021 | Kim | H01L 27/323 |
| 2022/0020824 A1 * | 1/2022 | Na | G06F 3/0443 |

* cited by examiner

< Mode 1 >

< Mode 2 >

< Mode 2 >

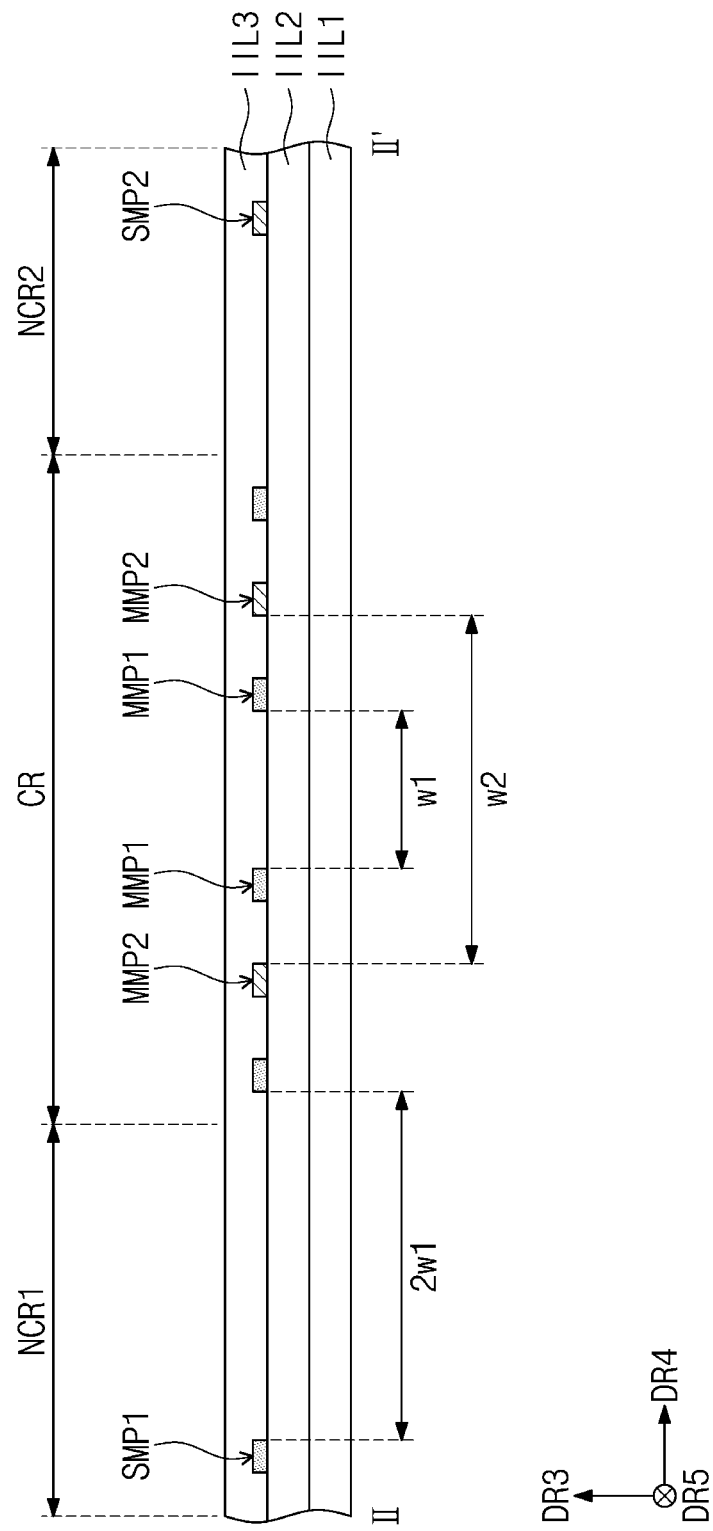

ELECTRONIC DEVICE

CROSS-REFERENCE TO RELATED APPLICATION

The present application claims priority to and the benefit of Korean Patent Application No. 10-2020-0087072, filed on Jul. 14, 2020, the entire content of which is hereby incorporated by reference.

BACKGROUND

Aspects of some embodiments of the present disclosure herein relate to an electronic device.

Multimedia electronic devices such as televisions, mobile phones, tablet computers, navigation systems, game consoles, and the like are utilized to display images. Such electronic devices may include input sensors, which are capable of providing a touch-based input mechanism to allow users to relatively easily input information or commands intuitively and conveniently in addition to a usual input manner such as buttons, keyboards, mouses, and the like.

The input sensor may sense a touch or pressure input using a user's body. There is an increasing demand for using an active pen for fine touch input for a user who is familiar with information input using a writing instrument or a specific application program (for example, application program for sketching or drawing).

The above information disclosed in this Background section is only for enhancement of understanding of the background and therefore the information discussed in this Background section does not necessarily constitute prior art.

SUMMARY

Aspects of some embodiments of the present disclosure herein relate to an electronic device, and for example, to an electronic device having relatively improved input sensing performance.

Aspects of some embodiments of the present disclosure include an electronic device in which sensing performance for an input using an active pen is relatively improved.

Aspects of some embodiments of the inventive concept include an electronic device including a display panel configured to display an image, an input sensor disposed on the display panel, and an input device configured to provide a second input to the input sensor. The input sensor includes a first sensing electrode and a second sensing electrode electrically insulated from the first sensing electrode and is configured to sense a first input in a first mode and sense a second input in a second mode.

According to some embodiments, at least one of the first and second sensing electrodes includes a main mesh pattern disposed in a crossing area in which the first and second sensing electrodes cross each other and a sub mesh pattern disposed in a non-crossing area in which the first and second sensing electrodes do not cross each other. The main mesh pattern has a size different from that of the sub mesh pattern.

According to some embodiments, an electronic device includes a display panel configured to display an image and an input sensor disposed on the display panel. The input sensor includes a first sensing electrode and a second sensing electrode that is electrically insulated from the first sensing electrode. The input sensor is configured to sense a first input in a first mode and sense a second input in a second mode.

According to some embodiments, the first sensing electrode includes a first main mesh pattern disposed in the crossing area and a first sub mesh pattern disposed in a first non-crossing area in which the first sensing electrode does not cross the second sensing electrode. The second sensing electrode includes a second main mesh pattern disposed in the crossing area and a second sub mesh pattern disposed in a second non-crossing area in which the second sensing electrode does not cross the first sensing electrode. The first main mesh pattern has a size different from that of the second main mesh pattern.

BRIEF DESCRIPTION OF THE FIGURES

The accompanying drawings are included to provide a further understanding of embodiments according to the inventive concept, and are incorporated in and constitute a part of this specification. The drawings illustrate embodiments of the inventive concept and, together with the description, serve to explain principles of the inventive concept. In the drawings:

FIG. 8C is a cross-sectional view taken along the line of FIG. 8A;

DETAILED DESCRIPTION

Figure 1A:
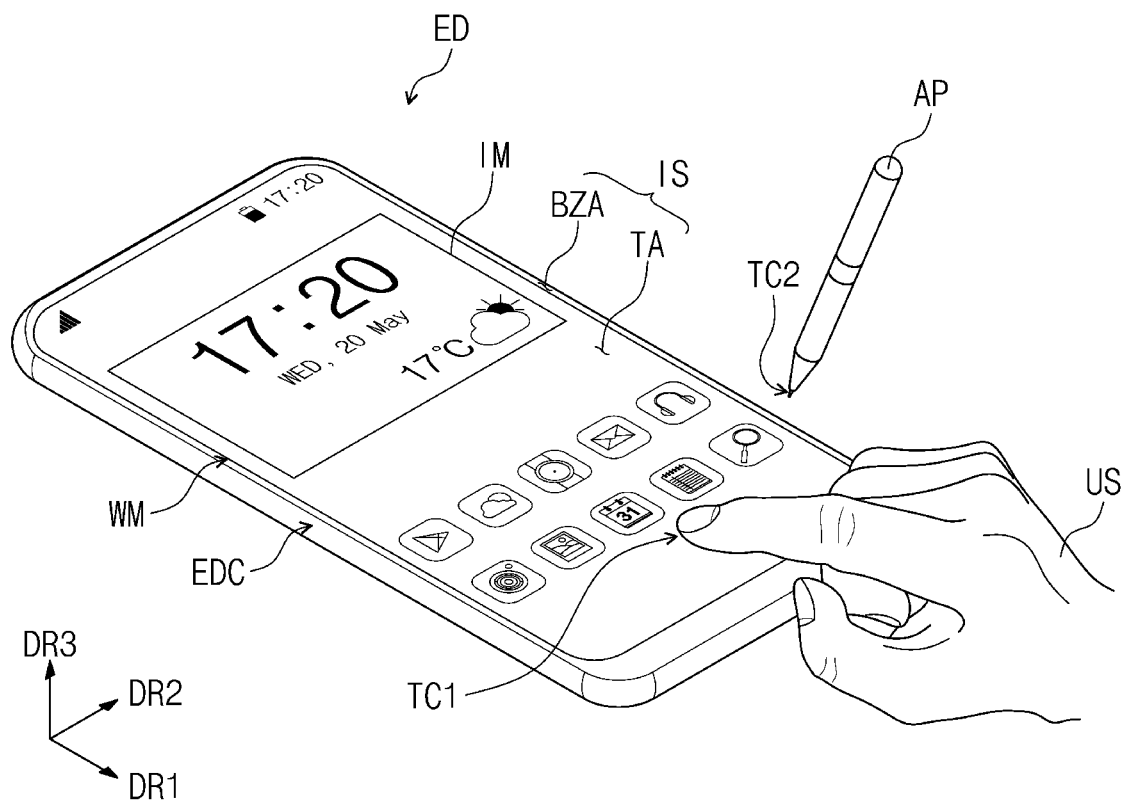
FIG. 1A is a perspective view of an electronic device according to some embodiments of the inventive concept.

In this specification, it will also be understood that when one component (or region, layer, portion) is referred to as being 'on', 'connected to', or 'coupled to' another component, it can be directly arranged/connected/coupled on/to the one component, or an intervening third component may also be present.

Like reference numerals refer to like elements throughout. Also, in the figures, the thickness, ratio, and dimensions of components are exaggerated for clarity of illustration.

The term "and/or" includes any and all combinations of one or more of the associated listed items.

It will be understood that although the terms such as 'first' and 'second' are used herein to describe various elements, these elements should not be limited by these terms. The terms are only used to distinguish one component from other components. For example, a first element referred to as a first element in one embodiment can be referred to as a second element in another embodiment without departing from the scope of the appended claims. The terms of a singular form may include plural forms unless referred to the contrary.

Also, "under", "below", "above', "upper", and the like are used for explaining relation association of components illustrated in the drawings. The terms may be a relative concept and described based on directions expressed in the drawings.

Unless otherwise defined, all terms (including technical and scientific terms) used herein have the same meaning as commonly understood by a person of ordinary skill in the art to which this invention belongs. Also, terms such as defined terms in commonly used dictionaries are to be interpreted as having meanings consistent with meaning in the context of the relevant art and are expressly defined herein unless interpreted in an ideal or overly formal sense.

The meaning of "include" or "comprise" specifies a property, a fixed number, a step, an operation, an element, a component or a combination thereof, but does not exclude other properties, fixed numbers, steps, operations, elements, components or combinations thereof.

Hereinafter, aspects of some embodiments of the inventive concept will be described with reference to the accompanying drawings.

Figure 1B:
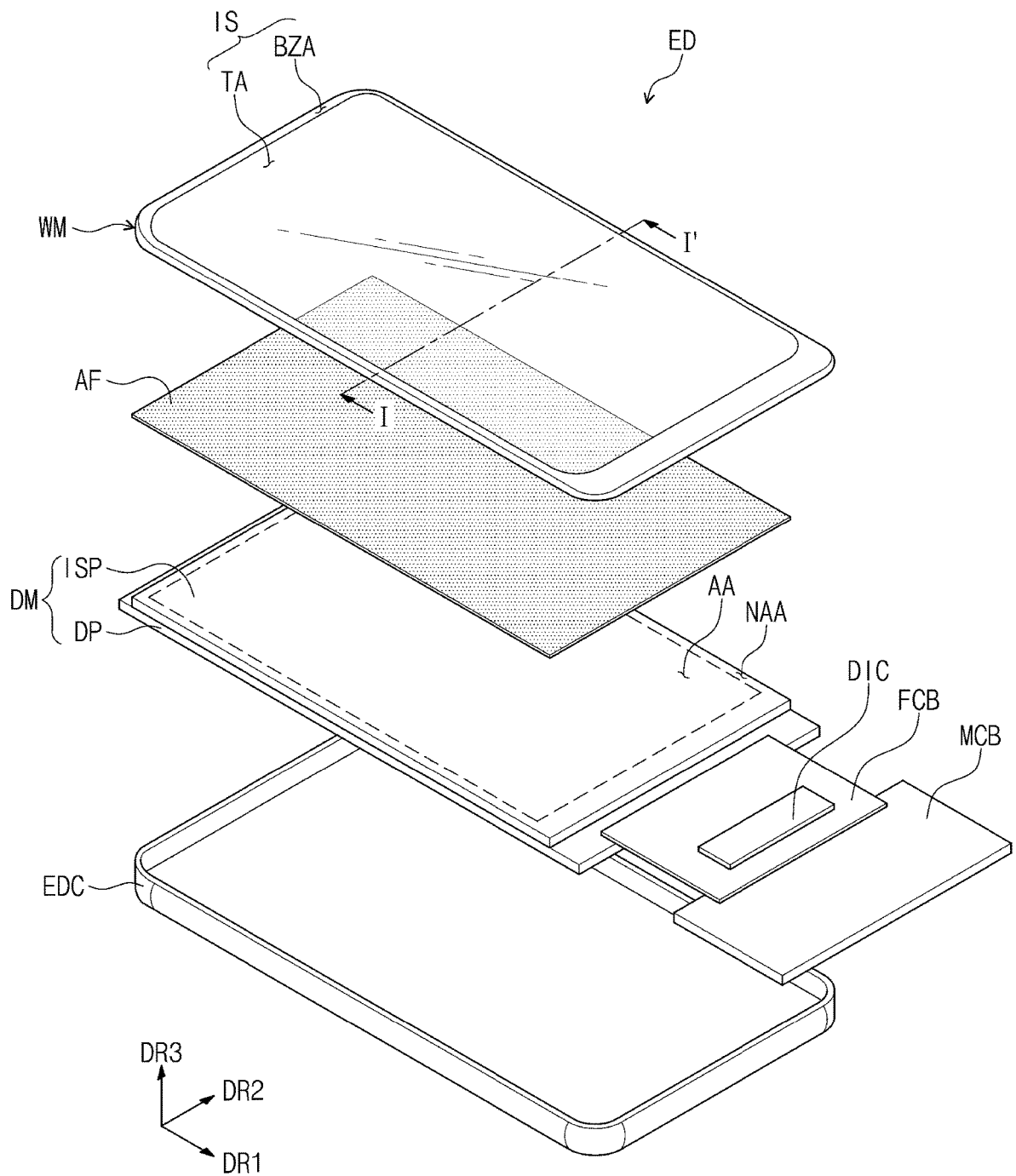
FIG. 1B is an exploded perspective view of the electronic device according to some embodiments of the inventive concept.
Figure 2A:
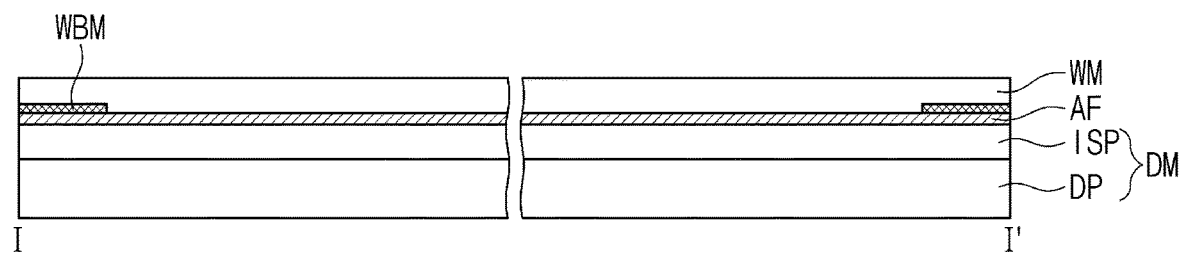
FIGS. 2A and 2B are cross-sectional views taken along the line of FIG. 1B.
Figure 2B:
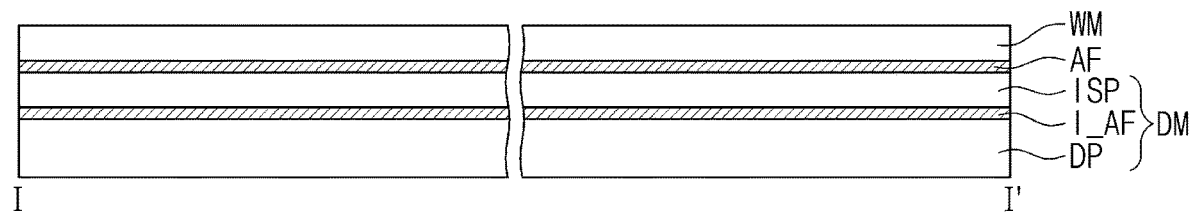

FIG. 1A is a perspective view of an electronic device according to some embodiments of the inventive concept, and FIG. 1B is an exploded perspective view of the electronic device according to some embodiments of the inventive concept. FIGS. 2A and 2B are cross-sectional views taken along the line I-I' of FIG. 1B.

Referring to FIGS. 1A to 2B, an electronic device ED may be a device that is activated according to an electrical signal. The electronic device ED may include various electronic devices or components. For example, the electronic device ED may be applied to electronic devices such as a smart watch, a tablet, a notebook, a computer, a smart television, and the like.

The electronic device ED may display an image IM in a third direction DR3 on a display surface IS parallel to each of first and second directions DR1 and DR2. The display surface IS on which the image IM is displayed may correspond to a front surface of the electronic device ED. The image IM may include a still image as well as a dynamic image.

According to some embodiments, a front surface (or a top surface) or a rear surface (or a bottom surface) of each of members may be defined based on a direction in which the image IM is displayed. The front and rear surfaces may be opposite to each other in the third direction DR3. A normal direction of each of the front and rear surfaces may be parallel to the third direction DR3.

A spaced distance between the front and rear surfaces in the third direction DR3 may correspond to a thickness of the electronic device ED in the third direction DR3. The directions indicated as the first to third directions DR1, DR2, and DR3 may be a relative concept and thus changed into different directions (e.g., according to the orientation of the electronic device ED).

The electronic device ED may sense an external input applied from the outside. The external input may include various types of inputs provided from the outside of the electronic device ED. The electronic device ED according to an embodiment of the inventive concept may sense a first input TC1 of a user US, which is applied from the outside. The first input TC1 of the user US may be one or a combination of various types of external inputs such as a portion of the user US's body, light, heat, or a pressure. In this embodiment, it is assumed that the first input TC1 of the user US is a touch input by a user US's hand applied to the front surface, but this is illustrative, and thus, as described above, the first input TC1 of the user US may be provided in various forms. Also, the electronic device ED may sense the first input TC1 (e.g., a touch input, for example, from a user US's finger) of the user US, which is applied to a side or rear surface of the electronic device ED, according to a structure of the electronic device ED, but embodiments according to the present disclosure are not limited thereto.

Also, the electronic device ED according to an embodiment of the inventive concept may sense a second input TC2 applied from the outside. The second input TC2 includes inputs by an electronic input device AP (for example, a stylus pen, an active pen, a touch pen, an electronic pen, an e-pen, etc.) in addition to the user US's hand. In the following description, a case in which the second input TC2 is an input by the active pen will be described as an example.

The front surface of the electronic device ED may be divided into a transmission area TA and a bezel area BZA. The transmission area TA may be an area on which the image IM is displayed. The user US may see the image IM that is displayed through the transmission area TA. According to some embodiments, each of vertexes of the transmission area TA may have a rounded rectangular shape. However, this is merely an example. For example, the electronic device ED may have various shapes and embodiments according to the present disclosure are not limited to any particular shape.

The bezel area BZA is adjacent to the transmission area TA. The bezel area BZA may have a color (e.g., a set or predetermined color). The bezel area BZA may surround the transmission area TA. Thus, the shape of the transmission area TA may be substantially defined by the shape or area of bezel area BZA. However, this is merely an example. For example, the bezel area BZA may be located adjacent to only one side of the transmission area TA or may be omitted. The electronic device ED according to some embodiments of the inventive concept may be implemented according to various embodiments, but is not limited to a specific embodiment.

As illustrated in FIG. 1B, the electronic device ED may include a display module DM and a window WM located on the display module DM. The display module DM may include a display panel DP and an input sensor ISP.

The display panel DP according to some embodiments of the inventive concept may be an emission type display panel, but embodiments according to the present disclosure are not limited thereto. For example, the display panel DP may be an organic light emitting display panel and a quantum-dot light emitting display panel. A light emitting layer of the organic light emitting display panel may include an organic light emitting material. A light emitting layer of the quantum dot light emitting display panel may include a quantum dot, a quantum rod, and the like. Hereinafter, the organic light emitting display panel will be described as an example of the display panel DP.

Referring to FIG. 2A, the input sensor ISP may be directly located on the display panel DR According to some embodiments of the inventive concept, the input sensor ISP may be located on the display panel DP through a continuous process. That is, when the input sensor ISP is directly located on the display panel DP, an adhesive film is not located between the input sensor ISP and the display panel DR However, as illustrated in FIG. 2B, an inner adhesive film I_AF may be located between the input sensor ISP and the display panel DP. In this case, the input sensor ISP may not be manufactured together with the display panel DP by the continuous process. Thus, after being manufactured through a process separate from the process of forming the display panel DP, the input sensor ISP may be fixed to a top surface of the display panel DP by the inner adhesive film I_AF.

The display panel DP generates an image IM, and the input sensor ISP acquires coordinate information of an external input (e.g., first and second inputs TC1 and TC2).

The window WM may be made of a transparent material that is capable of emitting an image. For example, the window WM may be made of glass, sapphire, plastic, and the like. Although the window WM is illustrated as a single layer, the embodiments of the inventive concept are not limited thereto. For example, according to some embodiments, the window WM may include a plurality of layers. According to some embodiments, the bezel area BZA of the above-described electronic device ED may be substantially provided as an area in which a material having a color (e.g., a set or predetermined color) is printed on one area of the window WM. According to some embodiments of the inventive concept, the window WM may include a light blocking pattern WBM for defining the bezel area BZA. The light blocking pattern WBM may be formed using a colored organic film, for example, in a coating manner.

The window WM may be coupled to the display module DM through the adhesive film AF. According to some embodiments of the inventive concept, the adhesive film AF may include an optically clear adhesive film (OCA). However, the adhesive film AF is not limited thereto and may include a typical adhesive or pressure-sensitive adhesive. For example, the adhesive film AF may include an optically clear resin (OCR) or a pressure sensitive adhesive film (PSA).

An antireflection layer may be further located between the window WM and the display module DM. The antireflection layer reduces reflectance of external light incident from an upper side of the window WM. The antireflection layer according to some embodiments of the inventive concept may include a retarder and a polarizer. The retarder may be a film type or liquid crystal coating type retarder and may include a $\lambda/2$ retarder and/or a $\lambda/4$ retarder. The polarizer may also be a film type or liquid crystal coating type polarizer. The film type may include an elongation-type synthetic resin, and the liquid crystal coating type may include liquid crystals that are arranged in an arrangement (e.g., a set or predetermined arrangement). The retarder and the polarizer may be implemented as one polarizing film.

As another example, the antireflection layer may include color filters directly located on the input sensor ISP or the display panel DP.

The display module DM may display an image IM according to an electrical signal and transmit/receive information on the external input. The display module DM may be divided into an active area AA and a peripheral area NAA. The active area AA may be defined as an area that emits the image IM provided from the display module DM.

The peripheral region NAA is adjacent to the active region AA. For example, the peripheral area NAA may surround the active area AA. However, this is merely an example. For example, the peripheral area NAA may have various shapes and is not limited to a specific embodiment. According to some embodiments, the active area AA of the display module DM may correspond to at least a portion of the transmission area TA.

The display module DM may further include a main circuit board MOB, a flexible circuit film FCB, and a driving chip DIC. The main circuit board MOB may be connected to the flexible circuit film FCB and electrically connected to the display panel DP. The main circuit board MOB may include a plurality of driving elements. The plurality of driving elements may include a circuit unit for driving the display panel DP. The flexible circuit film FCB is connected to the display panel DP to electrically connect the display panel DP to the main circuit board MCB. The driving chip DIC may be mounted on the flexible circuit film FCB.

The driving chip DIC may include driving elements for driving pixels of the display panel DP, for example, a data driving circuit. The flexible circuit film FCB according to some embodiments of the inventive concept is illustrated as one film, but embodiments according to the present disclosure are not limited thereto. For example, the flexible circuit film FCB may be provided in plurality and connected to the display panel DP. FIG. 1B illustrates a structure in which the driving chip DIC is mounted on the flexible circuit film FCB, but embodiments according to the inventive concept are not limited thereto. For example, the driving chip DIC may be directly mounted on the display panel DR In this case, a portion of the display panel DP, on which the driving chip DIG is mounted, may be bent to be located on a rear surface of the display module DM.

The input sensor ISP may be electrically connected to the main circuit board MCB through the flexible circuit film FCB. However, embodiments according to the inventive concept are not limited thereto. That is, the display module DM may additionally include a separate flexible circuit film for electrically connecting the input sensor ISP to the main circuit board MCB.

The electronic device ED further includes an external case EDC that accommodates the display module DM. The external case EDC may be coupled to the window WM to define an outer appearance of the electronic device ED. The external case EDC absorbs an impact applied from the outside and prevents foreign substances/moisture from being permeated into the display module DM to protect the components accommodated in the external case EDC, According to some embodiments, the external case EDC may be provided in a shape in which a plurality of accommodation members are bonded to each other.

The electronic device ED according to some embodiments includes an electronic module including various functional modules for driving the display module DM, a power supply module for supplying power required for the overall operation of the electronic device ED, and a bracket bonded to the display module DM and/or the external case EDC to divide an internal space of the electronic device ED.

Figure 3A:
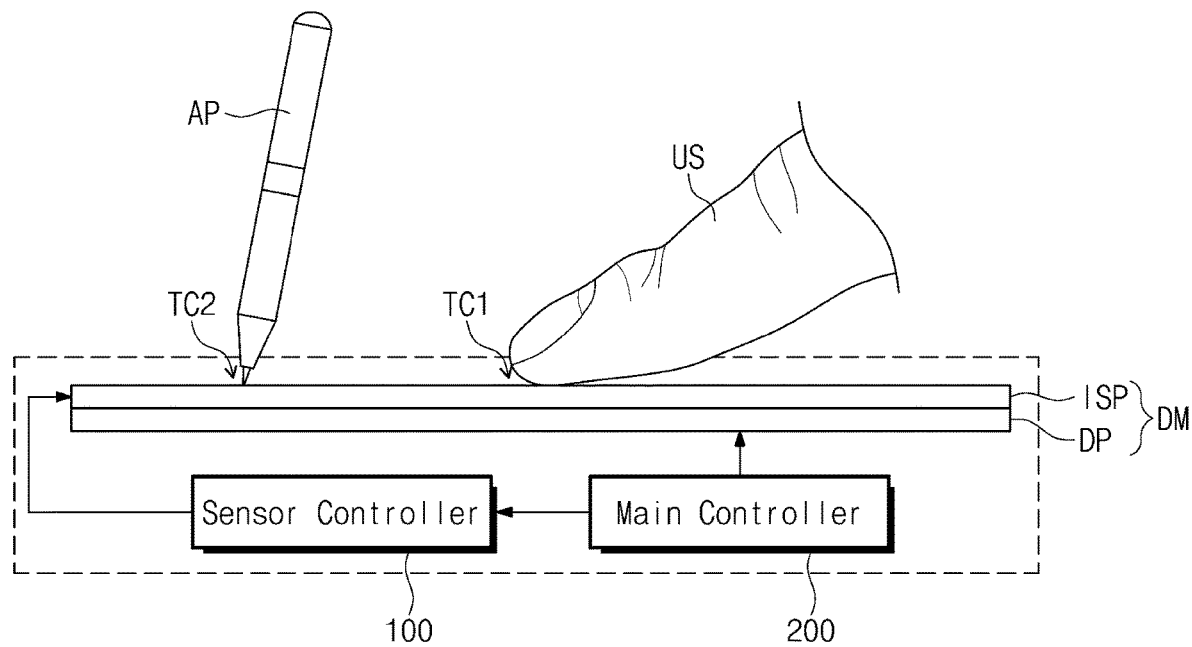
FIG. 3A is a block diagram for explaining an operation of the electronic device according to some embodiments of the inventive concept.
Figure 3B:
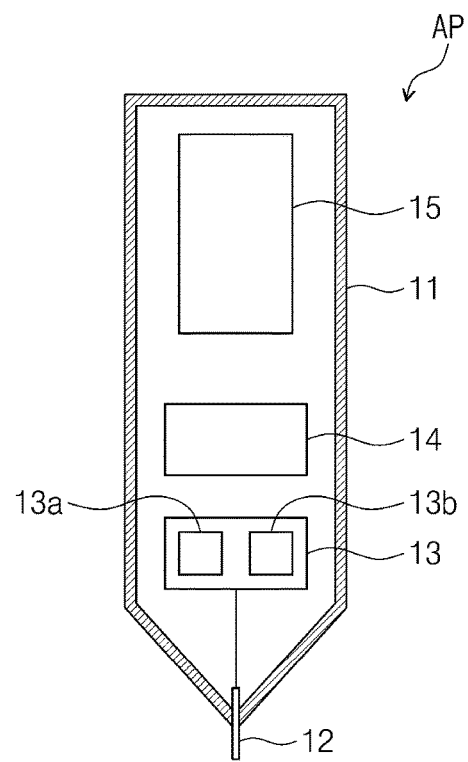
FIG. 3B is a block diagram of an input device of FIG. 3A.

FIG. 3A is a block diagram for explaining an operation of the electronic device according to some embodiments of the inventive concept, and FIG. 3B is a block diagram of an input device of FIG. 3A.

Referring to FIGS. 3A and 3B, the electronic device ED according to some embodiments of the inventive concept includes a main controller 200 for controlling driving of the display panel DP and a sensor controller 100 connected to the input sensor ISP. The main controller 200 may control driving of the sensor controller 100 connected to the input sensor ISP. According to some embodiments of the inventive concept, the main controller 200 and the sensor controller 100 may be mounted on the main circuit board MCB (see FIG. 1B). However, according to some embodiments, the sensor controller 100 may be embedded in the driving chip DIC (see FIG. 1B).

The input sensor ISP may include sensing electrodes. A structure of the input sensor ISP will be described in more detail later with reference to FIGS. 4 to 15B.

The sensor controller 100 may be connected to the sensing electrodes of the input sensor ISP. The sensor controller 100 may allow the input sensor ISP to operate in a first mode so as to sense the first input TC1 and also allow the input sensor ISP to operate in a second mode so as to sense the second input TC2.

As illustrated in FIG. 3B, the input device AP may include a housing 11, a conductive tip 12, and a communication module 13. The housing 11 may have a pen shape, and an accommodation space may be defined in the housing 11. The conductive tip 12 may protrude outward from an opened side of the housing 11. The conductive tip 12 may be a portion of the input device AP, which directly contacts the input sensor ISP.

The communication module 13 may include a transmission circuit 13a and a reception circuit 13b. The transmission circuit 13a may transmit a downlink signal to the sensor controller 100. The downlink signal may include a position of the input device AP, an inclination of the input device AR and state information. When the input device AP contacts the input sensor ISP, the sensor controller 100 may receive the downlink signal through the input sensor ISP.

The reception circuit 13b may receive an uplink signal from the sensor controller 100. The uplink signal may include information such as panel information, protocol version, and the like. The sensor controller 100 may supply the uplink signal to the input sensor ISP, and the input device AP may receive the uplink signal through the contact with the input sensor ISP.

The input device AP further includes an input controller 14 that controls driving of the input device AR The input controller 14 may be configured to operate according to a prescribed program. The transmission circuit 13a receives a signal supplied from the input controller 14 to modulate the received signal into a signal that is capable of being sensed by the input sensor ISP, and the reception circuit 13b receives a signal received through the input sensor ISP to modulate the received signal into a signal that is capable of being processed by the input controller 14.

The input device AP may further include a power module 15 for supplying power to each component of the input device AP.

Figure 4:
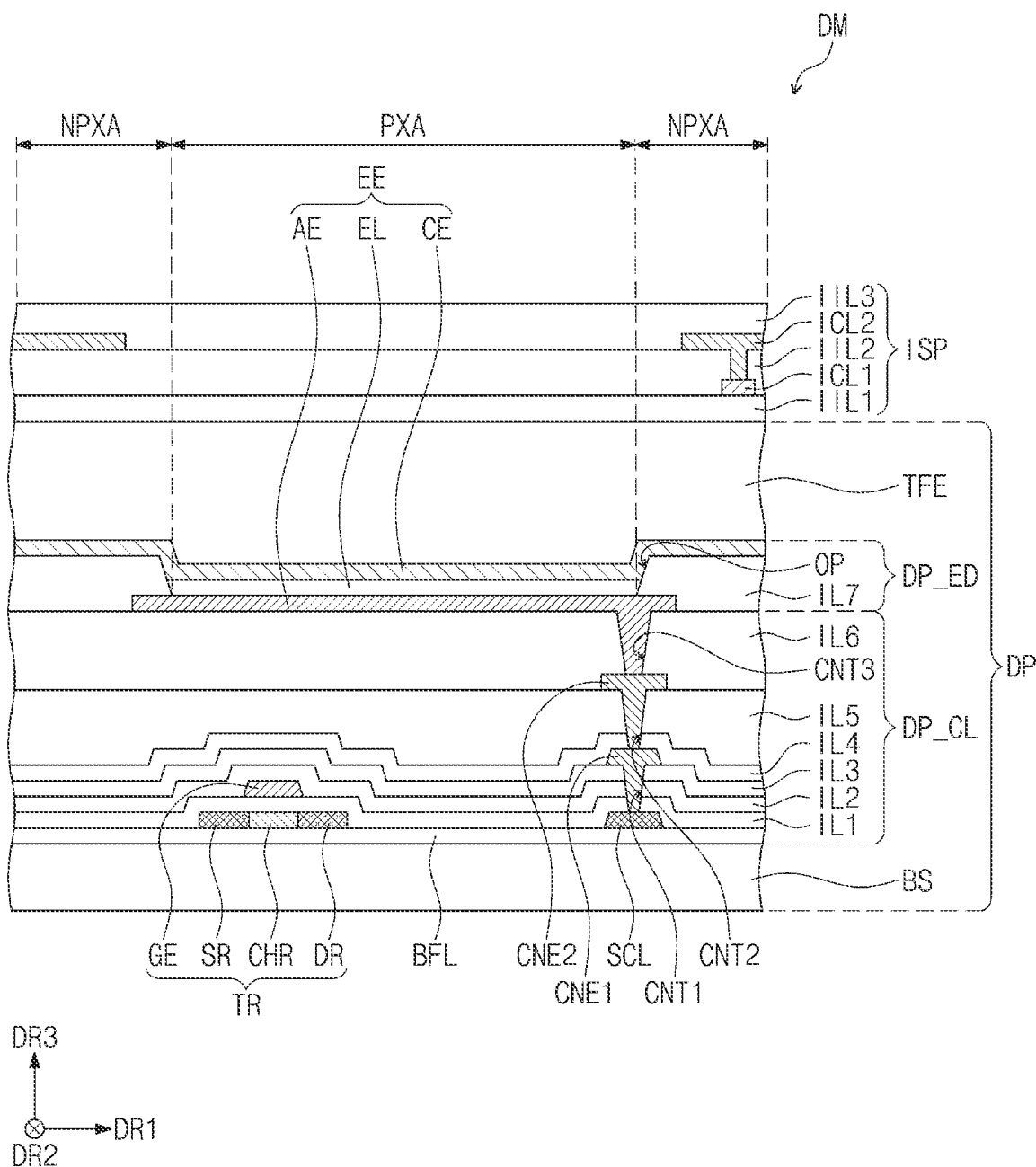
FIG. 4 is a cross-sectional view of a display module according to some embodiments of the inventive concept.

FIG. 4 is a cross-sectional view of the display module according to some embodiments of the inventive concept.

Referring to FIG. 4, the display module DM may include a display panel DP and an input sensor ISP located directly on the display panel DP. The display panel DP may include a base layer BS, a circuit layer DP_CL, a light emitting element layer DP_ED, and an encapsulation layer TFE.

The base layer BS may provide a base surface on which the circuit layer DP_CL is located. The base layer BS may be a glass substrate, a metal substrate, or a polymer substrate. However, the embodiments according to the inventive concept are not limited thereto. For example, the base layer BS may be an inorganic layer, an organic layer, or a composite layer.

The base layer BS may have a multilayered structure. For example, the base layer BS may have a three-layered structure constituted by a synthetic resin layer, an adhesive layer, and a synthetic resin layer. For example, the synthetic resin layer may include a polyimide-based resin. Also, the synthetic resin layer may include at least one of an acrylate-based resin, a methacrylate-based resin, a polyisoprene-based resin, a vinyl-based resin, an epoxy-based resin, a urethane-based resin, a cellulose-based resin, a siloxane-based resin, a polyimide-based resin, and a perylene-based resin.

The circuit layer DP_CL may be located on the base layer BS. The circuit layer DP_CL may include an insulating layer, a semiconductor pattern, a conductive pattern, and a signal line. The insulating layer, the semiconductor layer, and the conductive layer may be formed on the base layer BS in a manner such as coating or vapor deposition, and then, the insulating layer, the semiconductor layer, and the conductive layer may be selectively patterned through a plurality of photolithography processes. Thereafter, the semiconductor pattern, the conductive pattern, and the signal line included in the circuit layer DP_CL may be provided.

At least one inorganic layer may be located on a top surface of the base layer BS. The inorganic layer may include at least one of aluminum oxide, titanium oxide, silicon oxide, silicon oxynitride, zirconium oxide, and hafnium oxide. The inorganic layer may be provided as a multilayer. The multilayered inorganic layer may constitute a barrier layer and/or a buffer layer BFL. According to some embodiments, the display panel DP may include the buffer layer BFL.

The buffer layer BFL may improve bonding force between the base layer BS and the semiconductor pattern. The buffer layer BFL may include a silicon oxide layer and a silicon nitride layer, and the silicon oxide layer and the silicon nitride layer may be alternately laminated.

The semiconductor pattern may be located on the buffer layer BFL. The semiconductor pattern may include polysilicon. However, embodiments according to the inventive concept are not limited thereto. For example, the semiconductor pattern may include amorphous silicon or metal oxide.

FIG. 4 illustrates merely a portion of the semiconductor pattern. For example, the semiconductor pattern may be further located in other areas. The semiconductor pattern may be arranged in a specific rule over pixels. The semiconductor pattern has different electrical properties depending on whether the semiconductor pattern is doped. The semiconductor pattern may include a doped region and a non-doped region. The doped region may be doped with an N-type dopant or a P-type dopant. A PMOS transistor may include a doped region doped with the P-type dopant, and an NMOS transistor may include a doped region doped with the N-type dopant.

The doped region may have conductivity greater than that of a non-doped region and may substantially act as an electrode or a signal line. The non-doped region may substantially correspond to an active region (or a channel region) of the transistor. That is to say, a portion of the semiconductor pattern may be an active region of the transistor, and the other portion may be a source region or a drain region of the transistor.

Each of the pixels may have an equivalent circuit including seven transistors, one capacitor, and a light emitting element, and an equivalent circuit diagram of the pixel may be modified in various forms. In FIG. 4, one transistor TR and light emitting element EE, which are included in the pixel are illustrated as an example.

A source region SR, an active region CHR, and a drain region DR of the transistor TR may be formed from the semiconductor pattern. The source region SR and the drain region DR may be provided in opposite directions from the active region CHR on a cross section. FIG. 4 illustrates a portion of a signal line SCL located on the same layer as the semiconductor pattern. According to some embodiments, the signal line SCL may be electrically connected to the transistor TR on a plane.

A first insulating layer ID may be located on the buffer layer BFL. The first insulating layer ID commonly overlaps the plurality of pixels to cover the semiconductor pattern. The first insulating layer IL1 may include an inorganic layer and/or an organic layer and have a single-layered or multi-layered structure. The first insulating layer ID may include at least one of aluminum oxide, titanium oxide, silicon oxide, silicon oxide nitride, zirconium oxide, and hafnium oxide. According to some embodiments, the first insulating layer ID may include a single-layered silicon oxide layer. Each of insulating layers of the circuit layer DP_CL, which will be described later, as well as the first insulating layer ID may be an inorganic layer and/or an organic layer and may have a single-layered or a multilayered structure. The inorganic layer may include at least one of the above-described materials, but is not limited thereto.

A gate GE of the transistor TR is located on the first insulating layer ILA. The gate GE may be a portion of a metal pattern. The gate GE overlaps the active region CHR. In a process of doping the semiconductor pattern, the gate GE may function as a mask.

A second insulating layer IL2 may be located on the first insulating layer IL1 to cover the gate GE. The second insulating layer IL2 may commonly overlap the pixels. The second insulating layer IL2 may be an inorganic layer and/or an organic layer and have a single-layered or multilayered structure. According to some embodiments, the second insulating layer IL2 may be a single-layered silicon oxide layer.

A third insulating layer IL3 may be located on the second insulating layer IL2. According to some embodiments, the third insulating layer IL3 may be a single-layered silicon oxide layer.

A first connection electrode CNE1 may be located on the third insulating layer IL3. The first connection electrode CNE1 may be connected to the signal line SCL through a first contact hole CNT1 passing through the first, second, and third insulating layers IL1, IL2, and IL3.

A fourth insulating layer IL4 may be located on the third insulating layer IL3. The fourth insulating layer IL4 may be a single-layered silicon oxide layer. A fifth insulating layer IL5 may be located on the fourth insulating layer IL4. The fifth insulating layer IL5 may be an organic layer.

A second connection electrode CNE2 may be located on the fifth insulating layer IL5. The second connection electrode CNE2 may be connected to the first connection electrode CNE1 through a second contact hole CNT2 passing through the fourth insulating layer IL4 and the fifth insulating layer IL5.

A sixth insulating layer IL3 may be located on the fifth insulating layer IL5 to cover the second connection electrode CNE2. The sixth insulating layer IL6 may be an organic layer. The light emitting element layer DP_ED may be located on the circuit layer DP_CL. The light emitting element layer DP_ED may include a light emitting element EE. For example, the light emitting element layer DP_ED may include an organic light emitting material, quantum dots, quantum rods, a micro LED, or a nano LED. The light emitting element EE may include a first electrode AE, an emission layer EL, and a second electrode CE.

The first electrode AE may be located on the sixth insulating layer IL6. The first electrode AE may be connected to the second connection electrode CNE2 through a third contact hole CNT3 passing through the sixth insulating layer IL6.

A pixel defining layer IL7 may be located on the sixth insulating layer IL6 to cover a portion of the first electrode AE. An opening OP is defined in the pixel defining layer IL7. The opening OP of the pixel defining layer IL7 exposes at least a portion of the first electrode AE. According to some embodiments, an emission area PXA may be defined to correspond to a portion of an area of the first electrode AE exposed by the opening OP. A non-emission area NPXA may surround the emission area PXA.

The emission layer EL may be located on the first electrode AE. The emission layer EL may be located in the opening OP, That is, the emission layer EL may be arranged to be separated from each of the pixels. When the emission layer EL is arranged to be separated from each of the pixels, each of emission layers EL may emit light having at least one of blue, red, and green color. However, the embodiments of the inventive concept are not limited thereto. For example, the emission layer EL may be commonly provided to be connected to the pixels. In this case, the emission layer EL may provide blue light or white light.

The second electrode CE may be located on the emission layer EL. The second electrode CE may have an integrated shape and commonly located on the plurality of pixels. A common voltage may be provided to the second electrode CE, and the second electrode CE may be referred to as a common electrode.

According to some embodiments, a hole control layer may be located between the first electrode AE and the emission layer EL. The hole control layer may be commonly located in the emission area PXA and the non-emission area NPXA. The hole control layer may include a hole transport layer and may further include a hole injection layer. An electron control layer may be located between the emission layer EL and the second electrode CE. An electron control layer may include an electron transport layer and may further include an electron injection layer. The hole control layer and the electron control layer may be commonly formed in the plurality of pixels by using an open mask. The encapsulation layer TFE may be located on the light emitting element layer DP_ED. The encapsulation layer TFE may include an inorganic layer, an organic layer, and an inorganic layer, which are sequentially laminated, but layers constituting the encapsulation layer TFE are not limited thereto.

The inorganic layers may protect the light emitting element layer DP_ED against moisture and oxygen, and the organic layer may protect the light emitting element layer DP_ED against foreign substances such as dust particles or other contaminants. The inorganic layers may include a silicon nitride layer, a silicon oxy nitride layer, a silicon oxide layer, a titanium oxide layer, or an aluminum oxide layer. The organic layer may include an acrylic-based organic layer, but the embodiments of the inventive concept are not limited thereto.

The input sensor ISP may be located on the display panel DP through the continuous process. The input sensor ISP may include an input base layer IIL1, a first conductive layer ICL1, a sensing insulating layer IIL2, a second conductive layer ICL2, and a cover insulating layer IIL3.

The input base layer IIL1 may be an inorganic layer including any one of silicon nitride, silicon oxynitride, and silicon oxide. Alternatively, the input base layer IIL1 may be an organic layer including an epoxy resin, an acrylic resin, or an imide-based resin. Each of the input base layer IIL1 may have a single-layered structure or a multilayered structure in which a plurality of layers are laminated in the third direction DR3.

Each of the first conductive layer IOLA and the second conductive layer ICL2 may have a single-layered structure or a multilayered structure in which a plurality of layers are laminated in the third directional DR3. The conductive layer having the single-layered structure may include a metal layer or a transparent conductive layer. The metal layer may include molybdenum, silver, titanium, copper, aluminum, or an alloy thereof. The transparent conductive layer may include transparent conductive oxide such as indium tin oxide (ITO), indium zinc oxide (IZO), zinc oxide (ZnO), indium zinc tin oxide (IZTO), and the like. In addition, the transparent conductive layer may include conductive polymers such as PEDOT, metal nanowires, graphene, and the like.

The conductive layer having the multilayered structure may include metal layers. The metal layers may have a three-layered structure of titanium/aluminumnitanium. The conductive layer having the multilayered structure may include at least one metal layer and at least one transparent conductive layer.

At least one of the sensing insulating layer IIL2 and the cover insulating layer IIL3 may include an inorganic layer. The inorganic layer may include at least one of aluminum oxide, titanium oxide, silicon oxide, silicon oxynitride, zirconium oxide, and hafnium oxide.

At least one of the sensing insulating layer IIL2 and the cover insulating layer IIL3 may include an organic layer. The organic layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyimide-based resin, and a perylene-based resin.

Figure 5:
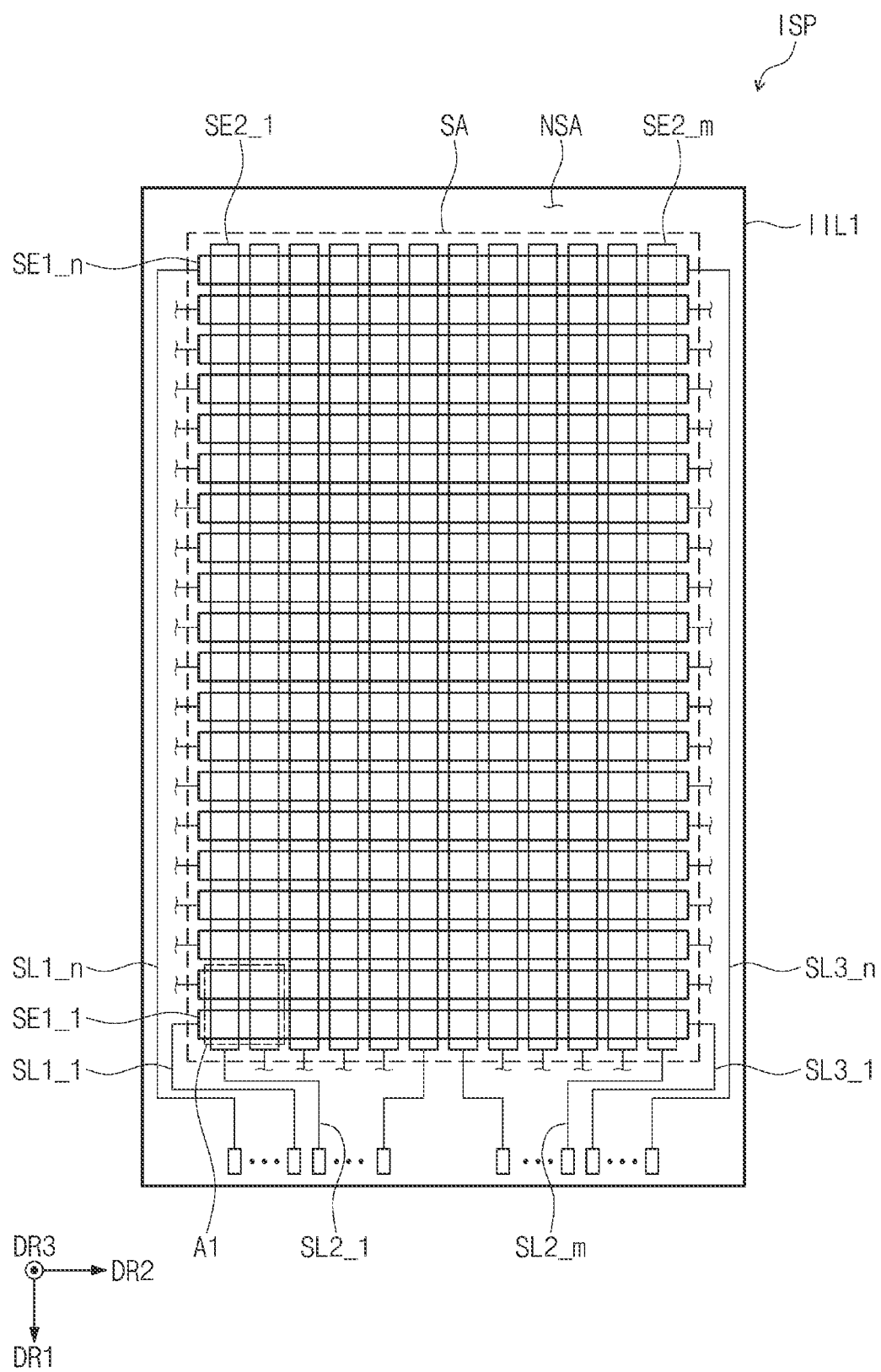
FIG. 5 is a plan view of an input sensor according to some embodiments of the inventive concept.
Figure 6:
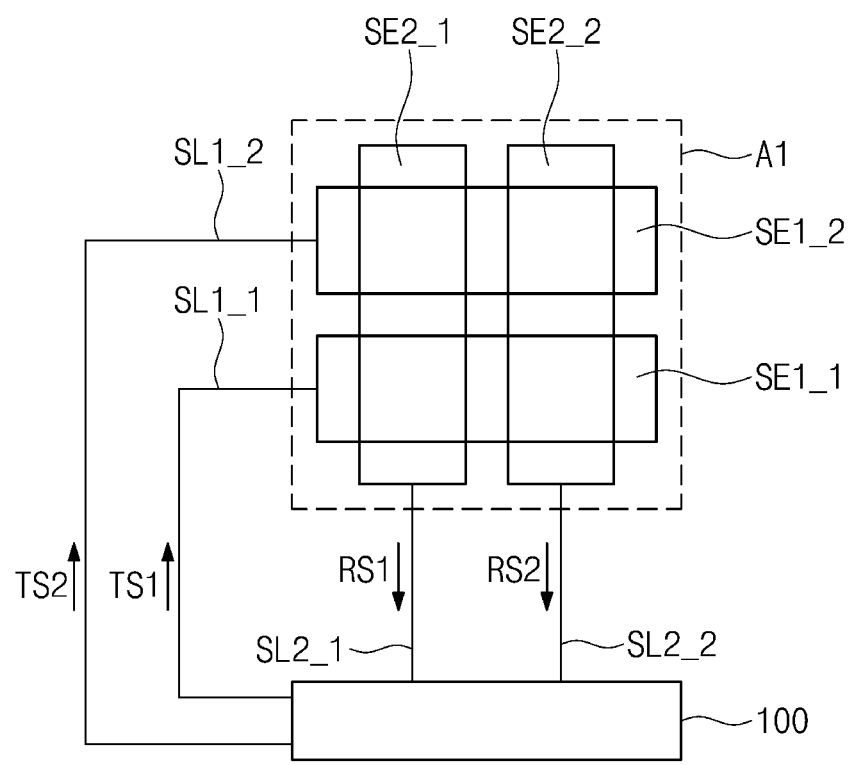
FIG. 6 is a view for explaining an operation of the input sensor in a first mode according to some embodiments.
Figure 7A:
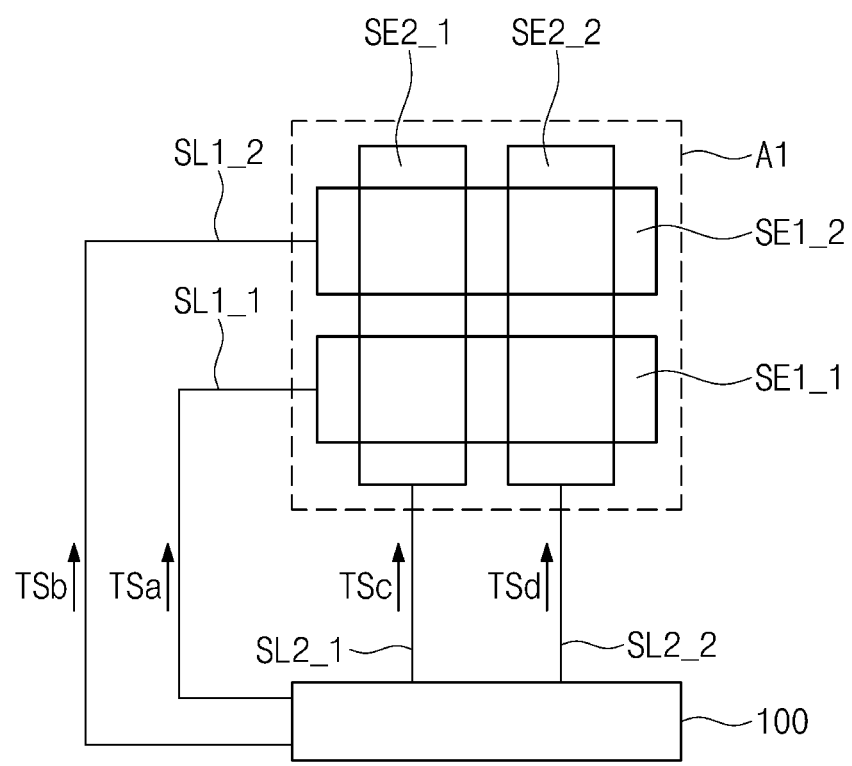
FIGS. 7A and 7B are views for explaining an operation of the input sensor in a second mode according to some embodiments.
Figure 7B:
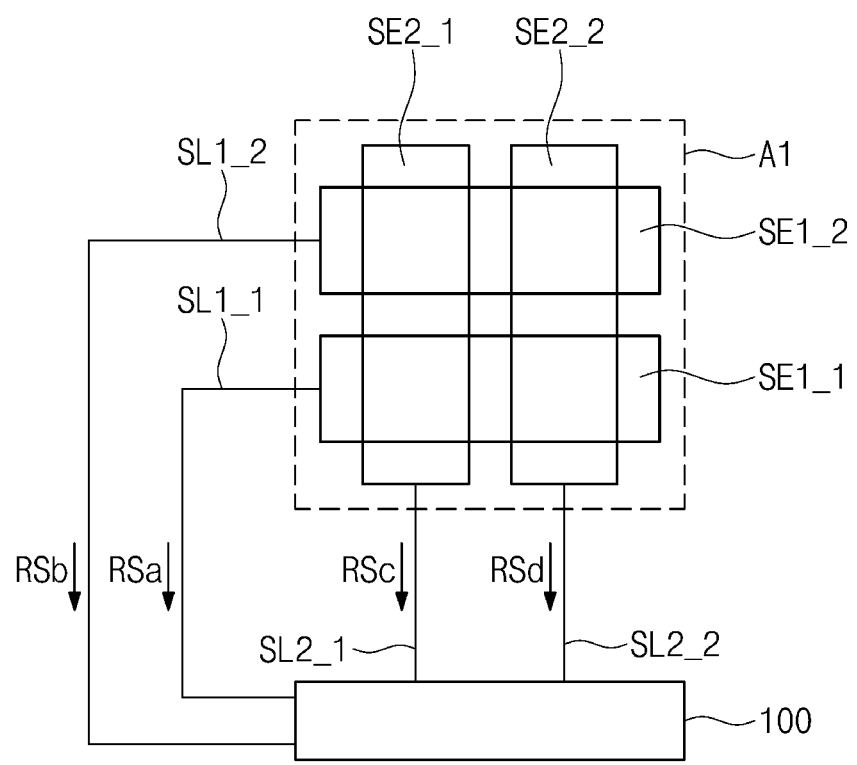

FIG. 5 is a plan view of the input sensor according to some embodiments of the inventive concept, and FIG. 6 is a view for explaining an operation of the input sensor in the first mode. FIGS. 7A and 7B are views for explaining an operation of the input sensor in the second mode.

Referring to FIGS. 3A and 5, the input sensor ISP may include a sensing area SA and a non-sensing area NSA. The sensing area SA may be an area that is activated according to an electrical signal. For example, the sensing area SA may be an area that senses an input. The non-sensing area NSA may surround the sensing area SA.

The input sensor ISP includes first sensing electrodes SE1_1 to SE1_$n$ and second sensing electrodes SE2_1 to SE2_$m$. The first sensing electrodes SE1_1 to SE1_$n$ and the second sensing electrodes SE2_1 to SE2_$m$ are electrically insulated from each other and cross each other. According to some embodiments of the inventive concept, the first sensing electrodes SE1_1 to SE1_$n$ include n first sensing electrodes SE1_1 to SE1_$n$, and the second sensing electrodes SE2_1 to SE2_$m$ include m second sensing electrodes SE2_1 to SE2_$m$. Here, n and m are natural numbers of 1 or more. The number n may be a number greater than the number m, but is not limited thereto. That is, the number n may be a number equal to or less than the number m.

Each of the first sensing electrodes SE1_1 to SE1_$n$ may extend in a bar shape in the second direction DR2. The first sensing electrodes SE1_1 to SE1_$n$ may be arranged to be spaced apart from each other in the first direction DR1. The first sensing electrodes SE1_1 to SE1_$n$ may have the same electrode width as each other in the first direction DR1. A spaced distance between the first sensing electrodes SE1_1 to SE1_$n$ in the first direction DR1 may be constant.

Each of the second sensing electrodes SE2_1 to SE2_$m$ may extend in a bar shape in the first direction DR1. The second sensing electrodes SE2_1 to SE2_$m$ may be arranged to be spaced apart from each other in the second direction DR2. The second sensing electrodes SE2_1 to SE1_$m$ may have the same electrode width as each other in the second direction DR2. A spaced distance between the second sensing electrodes SE2_1 to SE2_$m$ in the second direction DR2 may be constant.

The first sensing electrodes SE1_1 to SE1_$n$ and the second sensing electrodes SE2_1 to SE2_$m$ may cross each other. The first sensing electrodes SE1_1 to SE1_$n$ may be electrically separated from each other, and the second sensing electrodes SE2_1 to SE2_$m$ may be electrically separated from each other.

The input sensor ISP may operate in a first mode in which information on an external input is acquired through a change in mutual capacitance between the first sensing electrodes SE1_1 to SE1_$n$ and the second sensing electrodes SE2_1 to SE2_$m$ or a second mode in which an input by the input device AP (see FIG. 3A) is sensed through a change in capacitance of the first sensing electrodes SE1_1 to SE1_$n$ and the second sensing electrodes SE2_1 to SE2_$m$.

The input sensor ISP may further include a plurality of first sensing lines SL1_1 to SL1_$n$ and a plurality of second sensing lines SL2_1 to SL2_$m$. The first sensing electrodes SE1_1 to SE1_$n$ and the second sensing electrodes SE2_1 to SE2_$m$ may be located in the sensing area SA. The first sensing lines SL1_1 to SL1_$n$ and the second sensing lines SL2_1 to SL2_$m$ may be located in the non-sensing area NSA. The plurality of first sensing lines SL1_1 to SL1_$n$ are electrically connected to one sides of the first sensing electrodes SE1_1 to SE1_$n$, and the plurality of second sensing lines SL2_1 to SL2_$m$ are electrically connected to one sides of the second sensing electrodes SE2_1 to SE2_$m$, According to some embodiments of the inventive concept, the input sensor ISP may further include third sensing lines SL3_1 to SL3_$n$ electrically connected to another sides of the first sensing electrodes SE1_1 to SE1_$n$. However, the embodiments of the inventive concept are not limited thereto. That is, the third sensing lines SL3_1 to SL3_$n$ may be omitted.

The first sensing electrodes SE1_1 to SE1_n are electrically connected to the sensor controller 100 through the plurality of first sensing lines SL1_1 to SL1_n, and the second sensing electrodes SE2_1 to SE2_m are electrically connected to the sensor controller 100 through the plurality of second sensing lines SL2_1 to SL2_m.

Referring to FIGS. 3A, 5, and 6, in the first mode, the first sensing electrodes SE1_1 to SE1_n may operate as the transmission electrodes, and the second sensing electrodes SE2_1 to SE2_m may operate as the reception electrodes. In the first mode, the sensor controller 100 may sense the first input TC1 by sensing a change in mutual capacitance generated between the first sensing electrodes SE1_1 to SE1_n and the second sensing electrodes SE2_1 to SE2_m.

In the first mode, the sensor controller 100 may provide driving signals TS1 and TS2 to the first sensing electrodes SE1_1 to SE1_n. In the first mode, the sensor controller 100 may receive sensing signals RS1 and RS2 from the second sensing electrodes SE2_1 to SE2_m. Thus, the sensor controller 100 may compare the driving signals TS1 and TS2 with the corresponding sensing signals RS1 and RS2 to calculate a coordinate value for a position at which the first input TC1 is provided based on an amount of change therebetween.

Referring to FIGS. 3A, 5, 7A, and 7B, when the input device AP approaches the input sensor ISP, the input sensor ISP may enter the second mode for sensing the second input TC2. The input device AP may transmit data to the sensor controller 100 through the input sensor ISP or receive data from the sensor controller 100 through the input sensor ISP.

In the second mode, each of the first sensing electrodes SE1_1 to SE1_n and the second sensing electrodes SE2_1 to SE2_m may be utilized as the transmission electrode for providing uplink signals TSa, TSb, TSc, and TSd provided from the sensor controller 100 to the input device AP. In the second mode, each of the first sensing electrodes SE1_1 to SE1_n and the second sensing electrodes SE2_1 to SE2_m may be utilized as the reception electrodes for providing downlink signals RSa, RSb, RSc, and RSd provided from the input device AP to the sensor controller 100. That is, in the second mode, all of the first sensing electrodes SE1_1 to SE1_n and the second sensing electrodes SE2_1 to SE2_m may be utilized as the transmission electrodes or may be utilized as the reception electrodes.

When each of the first sensing electrodes SE1_1 to SE1_n and the second sensing electrodes SE2_1 to SE2_m is provided in the bar shape, a change in mutual capacitance between the first sensing electrodes SE1_1 to SE1_n and the second sensing electrodes SE2_1 to SE2_m may be substantially constantly maintained even if the input device AP moves. Therefore, in the second mode, even if the second input TC2 moves, the movement may be relatively accurately sensed. That is, it may be possible to prevent the second input TC2 provided in the form of a line from being distorted by the amount of change in mutual capacitance described above, such as when writing a letter or drawing a picture using the input device AP. As a result, linearity of the second input TC2 may be relatively improved.

Figure 8A:
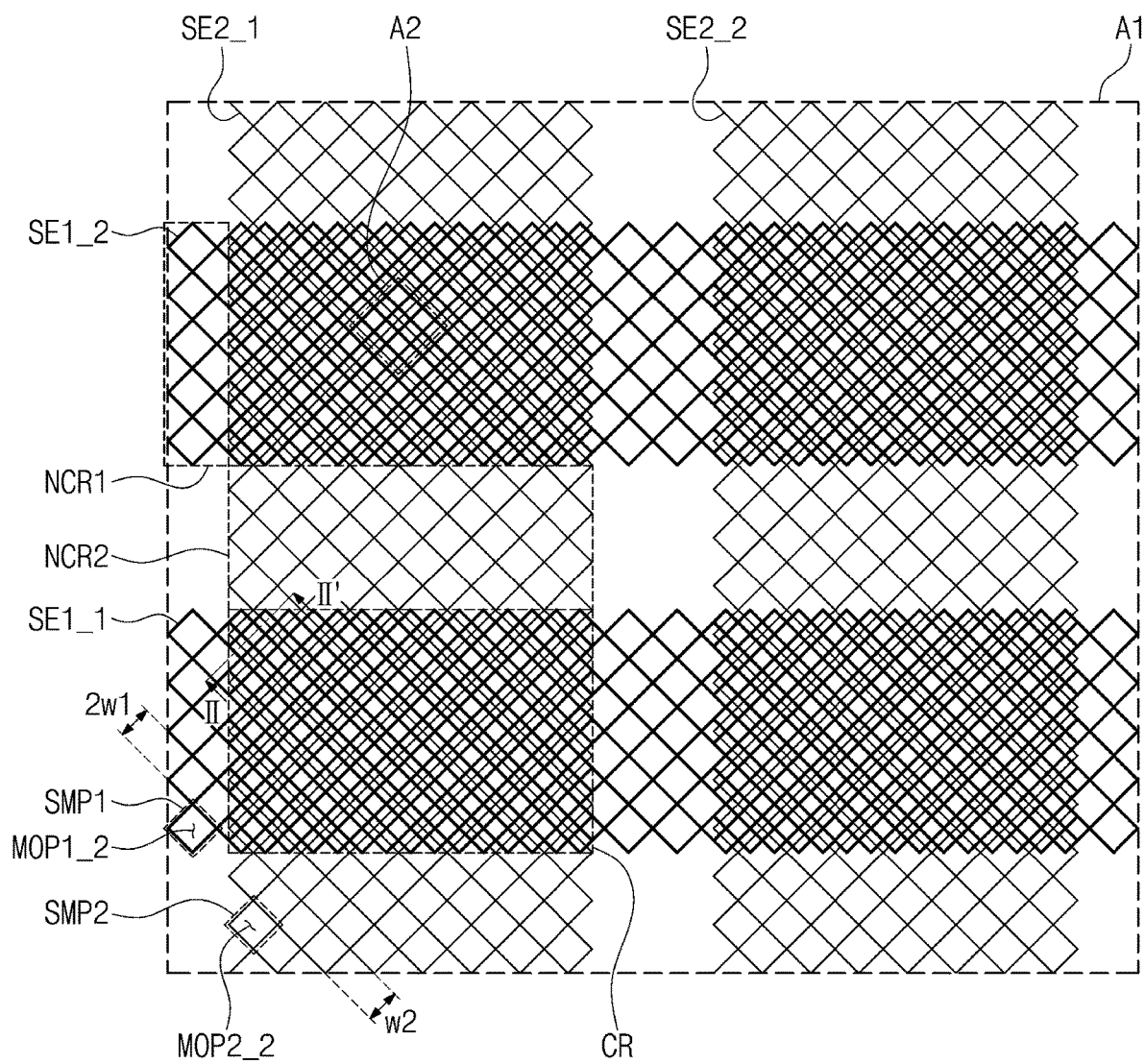
FIG. 8A is an enlarged plan view of an area A1 of FIG. 5 according to some embodiments of the inventive concept.
Figure 8B:
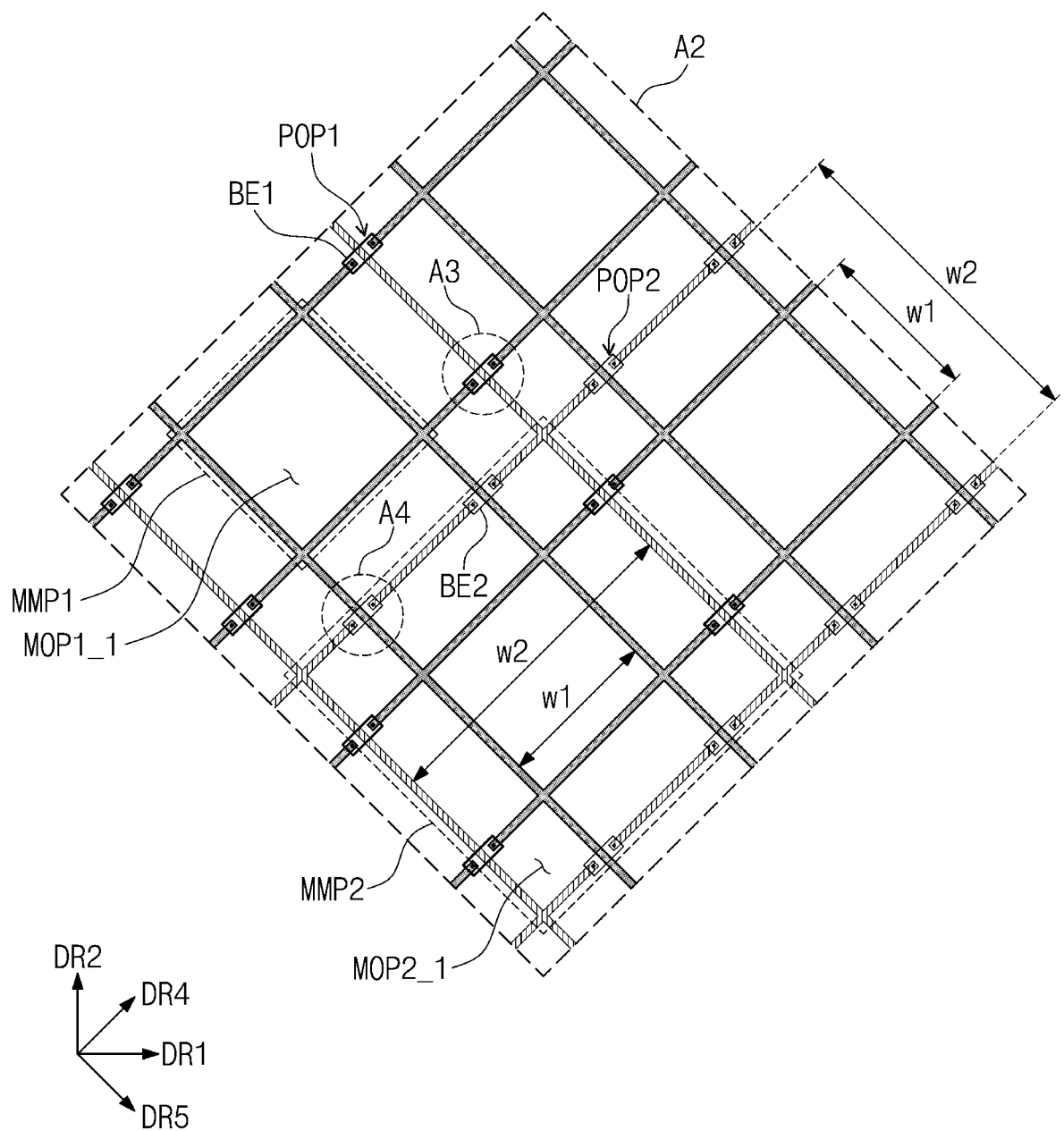
FIG. 8B is an enlarged plan view of an area A2 of FIG. 8A.

FIG. 8A is an enlarged plan view of an area A1 of FIG. 5 according to some embodiments of the inventive concept, and FIG. 8B is an enlarged plan view of an area A2 of FIG. 8A. FIG. 8C is a cross-sectional view taken along the line II-II' of FIG. 8A.

Referring to FIGS. 8A to 8C, each of the first sensing electrodes SE1_1 and SE1_2 and the second sensing electrodes SE2_1 and SE2_2 may have a mesh structure.

Each of the first sensing electrodes SE1_1 and SE1_2 may include a plurality of mesh patterns defined to have a mesh structure. Here, the mesh patterns included in each of the first sensing electrodes SE1_1 and SE1_2 may be defined as a plurality of first mesh patterns. The plurality of first mesh patterns may include a first main mesh pattern MMP1 and a first sub mesh pattern SMP1. The first main mesh pattern MMP1 is located in a crossing area CR in which the first sensing electrodes SE1_1 and SE1_2 and the second sensing electrodes SE2_1 and SE2_2 cross each other. The first sub mesh pattern SMP1 is located in a first non-crossing area NCR1 in which the first sensing electrodes SE1_1 and SE1_2 do not cross the second sensing electrodes SE2_1 and SE2_2.

The first main mesh pattern MMP1 may have a diamond shape by a first mesh line extending in a fourth direction DR4 that is inclined with respect to the first and second directions DR1 and DR2 and a second mesh line extending in a fifth direction DR5 that is inclined with respect to the first and second directions DR1 and DR2 and crosses the fourth direction DR4. The first sub mesh pattern SMP1 may have a diamond shape by a third mesh line extending in the fourth direction DR4 and a fourth mesh line extending in the fifth direction DR5. FIGS. 8A and 8B illustrate a structure in which each of the first main mesh pattern MMP1 and the first sub mesh pattern SMP1 have the diamond shape, but the shape thereof are not limited thereto. For example, each of the first main mesh pattern MMP1 and the first sub mesh pattern SMP1 may have a triangular shape, a rectangular shape, a circular shape, a V shape, and the like.

The first main mesh pattern MMP1 may have a size that is equal to or different from that of the first sub mesh pattern SMP1. According to some embodiments of the inventive concept, the first main mesh pattern MMP1 may have a size less than that of the first sub mesh pattern SMP1. For example, the first main mesh pattern MMP1 may have a size corresponding to about ½ times or about ¼ times of the first sub mesh pattern SMP1.

A first main mesh opening MOP1_1 may be defined in the first main mesh pattern MMP1 by the first and second mesh lines. The first main mesh opening MOP1_1 may have a first width w1 in the fourth and fifth directions DR4 and DR5. A first sub mesh opening MOP1_2 may be defined in the first sub mesh pattern SMP1 by the third and fourth mesh lines. The first sub mesh opening MOP1_2 may have a width greater than the first width w1 in the fourth and fifth directions DR4 and DR5. According to some embodiments of the inventive concept, the first sub mesh opening MOP1_2 may have a width twice or four times greater than that of the first main mesh opening MOP1_1. FIG. 8A illustrates a structure in which the first sub mesh opening MOP1_2 has a width $2w1$ twice greater than the first width w1 in the fourth and fifth directions DR4 and DR5 when compared to the first main mesh opening MOP1_1, but the embodiments of the inventive concept are not limited thereto. Here, the first main mesh opening MOP1_1 and the first sub mesh opening MOP1_2 may overlap the emission area PXA described in FIG. 4.

Each of the second sensing electrodes SE2_1 and SE2_2 may include a plurality of mesh patterns defined to have a mesh structure. Here, the mesh patterns included in each of the second sensing electrodes SE2_1 and SE2_2 may be defined as a plurality of second mesh patterns. The plurality of second mesh patterns may include a second main mesh pattern MMP2 and a second sub mesh pattern SMP2. The second main mesh pattern MMP2 is located in the crossing area CR, and the second sub mesh pattern SMP2 is located in a second non-crossing area NCR2 in which the second sensing electrodes SE2_1 and SE2_2 do not cross the first sensing electrodes SE1_1 and SE1_2.

The second main mesh pattern MMP2 may have a diamond shape by a fifth mesh line extending in the fourth direction DR4 and a sixth mesh line extending in the fifth direction DR5. The second sub mesh pattern SMP2 may have a diamond shape by a seventh mesh line extending in the fourth direction DR4 and an eighth mesh line extending in the fifth direction DR5. FIGS. 8A and 8B illustrate a structure in which each of the second main mesh pattern MMP2 and the second sub mesh pattern SMP2 have the diamond shape, but the shape thereof are not limited thereto. For example, each of the second main mesh pattern MMP2 and the second sub mesh pattern SMP2 may have a triangular shape, a rectangular shape, a circular shape, a V shape, and the like.

The second main mesh pattern MMP2 may have a size that is equal to or different from that of the second sub mesh pattern SMP2. The second main mesh pattern MMP2 may have a size that is equal to or different from that of the first main mesh pattern MMP1, and the second sub mesh pattern SMP2 may have a size that is equal to or different from that of the first sub mesh pattern SMP1. According to some embodiments of the inventive concept, the second main mesh pattern MMP2 may have the same size as the second sub mesh pattern SMP2, and the second sub mesh pattern SMP2 may have the same size as the first sub mesh pattern SMP1.

A second main mesh opening MOP2_1 may be defined in the second main mesh pattern MMP2 by the fifth and sixth mesh lines. The second main mesh opening MOP2_1 may have a second width w2 in the fourth and fifth directions DR4 and DR5. A second sub mesh opening MOP2_2 may be defined in the second sub mesh pattern SMP2 by the seventh and eighth mesh lines. The second sub mesh opening MOP2_2 may have a width equal to or greater than the second width w2 in the fourth and fifth directions DR4 and DR5. According to some embodiments of the inventive concept, the second sub mesh opening MOP2_2 may have the same width as the second width w2 in the fourth and fifth directions DR4 and DR5. Here, the second main mesh opening MOP2_1 and the second sub mesh opening MOP2_2 may overlap the emission area PXA described in FIG. 4.

According to some embodiments of the inventive concept, at least one of the first sensing electrodes SE1_1 and SE1_2 and the second sensing electrodes SE2_1 and SE2_2 in the crossing area CR may include a main mesh pattern having a size less than that of the sub mesh pattern. Thus, at least one first main mesh pattern MMP1 may be arranged to cross one second main mesh pattern MMP2 in the crossing area CR. Thus, a spaced distance between the first main mesh pattern MMP1 and the second main mesh pattern MMP2 may be less than the first width w1 at a portion at which the first main mesh pattern MMP1 and the second main mesh pattern MMP2 cross each other. That is, the distance between the first sensing electrodes SE1_1 and SE1_2 and the second sensing electrodes SE2_1 and SE2_2 may be reduced, and as a result, in the first mode, when the first input TC1 is sensed using the mutual capacitance between the first sensing electrodes SE1_1 and SE1_2 and the second sensing electrodes SE2_1 and SE2_2, sensing sensitivity may be improved.

On the other hand, when the total capacitance of the first sensing electrodes SE1_1 and SE1_2 and the second sensing electrodes SE2_1 and SE2_2 is greater than or equal to a reference value, the sensing sensitivity in the second mode may be deteriorated. According to some embodiments of the inventive concept, the reference value may be about 200 picofarads, but is not particularly limited thereto.

In the second mode, the first and second main mesh patterns MMP1 and MMP2 and the first and second sub mesh patterns SMP1 and SMP2 may be determined in size so that the total capacitance of the first sensing electrodes SE1_1 and SE1_2 and the second sensing electrodes SE2_1 and SE2_2 is maintained below the reference value. That is, the first and second sub mesh patterns SMP1 and SMP2 that do not affect the sensing sensitivity in the first mode may increase in size to improve the sensing sensitivity in the second mode. Also, at least one of the first and second main mesh patterns MMP1 and MMP2 that affect the sensing sensitivity in the first mode may have a size less than that of each of the first and second sub mesh patterns SMP1 and SMP2 to improve the sensing sensitivity in the first mode.

FIGS. 8A to 8C illustrate a structure, in which each of the first main mesh patterns MMP1 has a size less than that of each of the first sub mesh patterns SMP1 according to some embodiments of the inventive concept, but the embodiments of the inventive concept are not limited thereto. For example, each of the second main mesh patterns MMP2 may have a size less than that of each of the second sub mesh patterns SMP2.

Also, as illustrated in FIGS. 8A to 8C, the first and second sub mesh patterns SMP1 and SMP2 may have the same size. However, the embodiments of the inventive concept are not limited thereto. For example, the first and second sub mesh patterns SMP1 and SMP2 may have sizes different from each other.

Figure 9A:
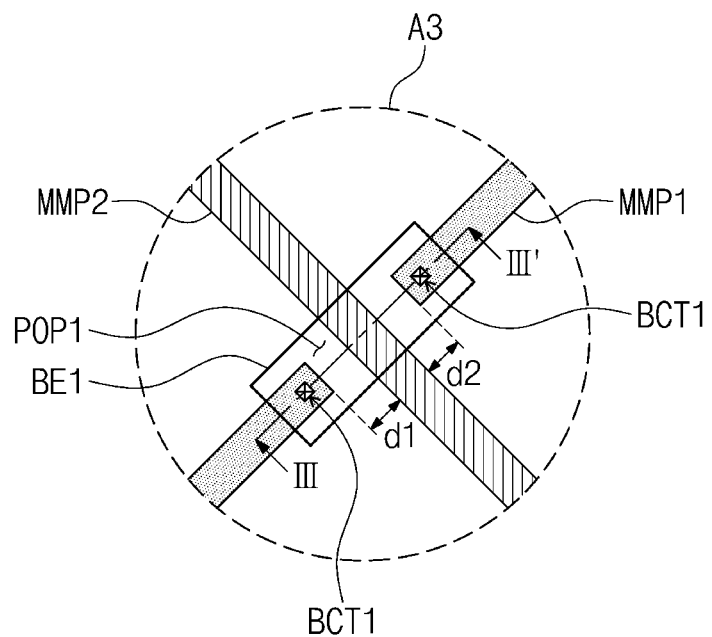
FIG. 9A is an enlarged plan view of an area A3 of FIG. 8B.
Figure 9B:
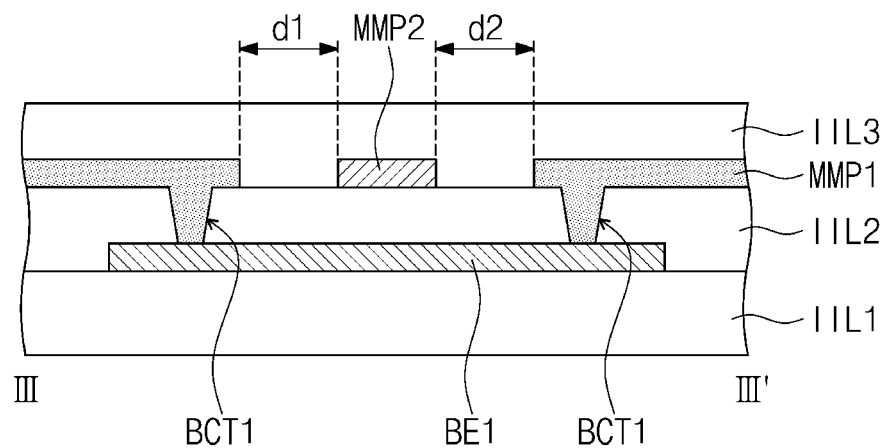
FIG. 9B is a cross-sectional view taken along the line of FIG. 9A.
Figure 10A:
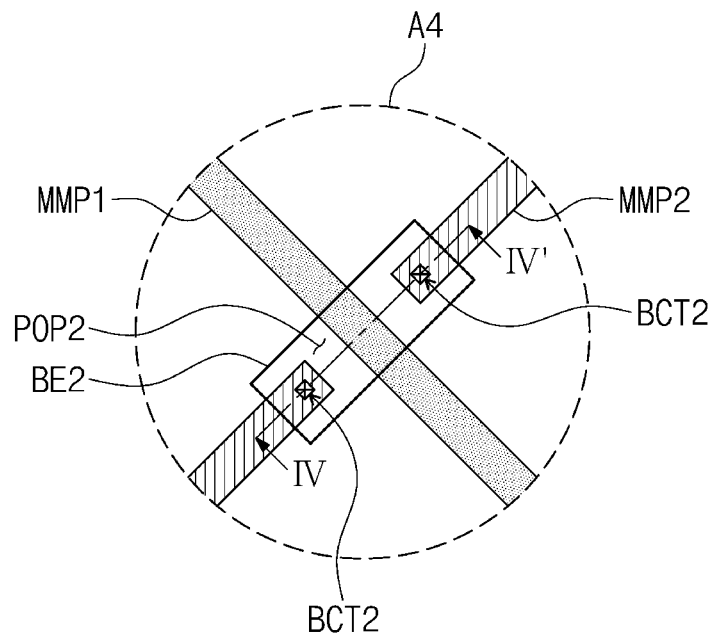
FIG. 10A is an enlarged plan view of an area A4 of FIG. 8B.
Figure 10B:
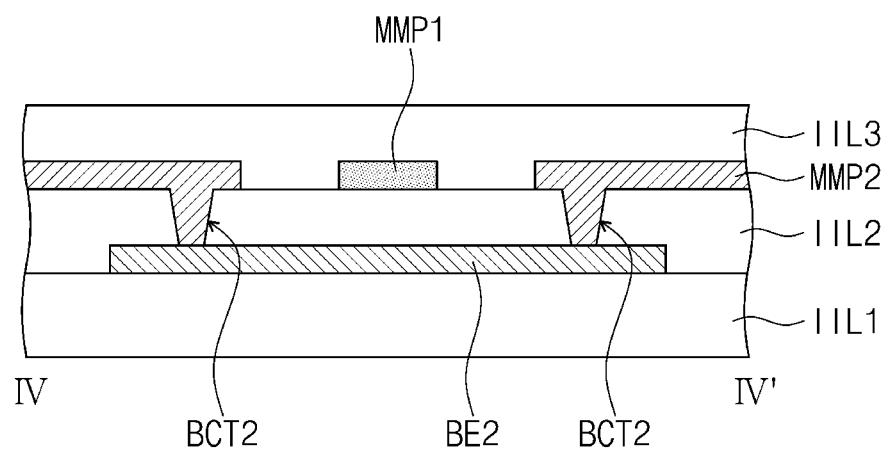
FIG. 10B is a cross-sectional view taken along the line IV-IV' of FIG. 10A.

FIG. 9A is an enlarged plan view of an area A3 of FIG. 8B, and FIG. 9B is a cross-sectional view taken along the line III-III' of FIG. 9A. FIG. 10A is an enlarged plan view of an area A4 of FIG. 8B, and FIG. 10B is a cross-sectional view taken along the line of FIG. 10A.

Referring to FIGS. 8A, 8B, 8C, 9A, and 9B, the first sensing electrodes SE1_1 and SE1_2 and the second sensing electrodes SE2_1 and SE2_2 are located on the same layer. Particularly, in the crossing area CR, the first main mesh patterns MMP1 and the second main mesh patterns MMP2 are located on the same layer. According to some embodiments of the inventive concept, the first main mesh patterns MMP1 and the second main mesh patterns MMP2 may be located on the sensing insulating layer IIL2.

The first sensing electrodes SE1_1 and SE1_2 may further include first connection openings POP1 provided by opening the first main mesh patterns MMP1. The second main mesh patterns MMP2 may be arranged to pass through the first connection openings POP1. According to some embodiments of the inventive concept, the first connection openings POP1 may be arranged in the fifth direction DR5. The first sensing electrodes SE1_1 and SE1_2 further include a first bridge pattern BE1 for electrically connecting the first main mesh patterns MMP1 spaced apart from each other by the first connection openings POP1 to each other.

A structure in which the first main mesh patterns MMP1 located at one side and the other side with respect to the second main mesh patterns MMP2 passing through the first connection openings POP1 are spaced a distance (e.g., a set or predetermined distance) from the second main mesh patterns MMP2 (i.e., a symmetrically spaced structure) is illustrated. However, the embodiments of the inventive concept are not limited thereto. For example, a distance d1 between the first main mesh pattern MMP1 and the second main mesh patterns MMP2 located at one side with respect to the second main mesh patterns MMP2 passing through the first connection openings POP1 may be different from a distance d2 between the first main mesh pattern MMP1 and the second main mesh patterns MMP2 located at the other side.

Referring to FIGS. 8A, 8B, 8C, 10A, and 10B, the second sensing electrodes SE2_1 and SE2_2 may further include second connection openings POP2 provided by opening the second main mesh pattern MMP2. The first main mesh patterns MMP1 may be arranged to pass through the second connection openings POP2. According to some embodiments of the inventive concept, the second connection openings POP2 may be arranged in the fourth direction DR4. The second sensing electrodes SE2_1 and SE2_2 may further include a second bridge pattern BE2 for electrically connecting the second main mesh patterns MMP2 spaced apart from each other by the second connection openings POP2 to each other.

The first and second bridge patterns BE1 and BE2 may be located on the same layer. According to some embodiments of the inventive concept, the first and second bridge patterns BE1 and BE2 may be located on the input base layer IIL1. First and second bridge contact holes BCT1 and BCT2 for exposing the first and second bridge patterns BE1 and BE2, respectively, may be provided in the sensing insulating layer IIL2. The first main mesh patterns MMP1 are electrically connected to the first bridge pattern BE1 through the first bridge contact hole BCT1, and the second main mesh patterns MMP2 are electrically connected to the second bridge pattern BE2 through the second bridge contact hole BCT2.

The first and second bridge patterns BE1 and BE2 are located on a layer different from that of the first and second main mesh patterns MMP1 and MMP2. FIGS. 9B and 10B illustrate a structure in which the first and second main mesh patterns MMP1 and MMP2 are located on the sensing insulating layer IIL2, and the first and second bridge patterns BE1 and BE2 are located on the input base layer 11121 but the embodiments of the inventive concept are not limited thereto. That is, the first and second main mesh patterns MMP1 and MMP2 may be located on the input base layer IIL1, and the first and second bridge patterns BE1 and BE2 may be located on the sensing insulating layer IIL2.

Figure 11:
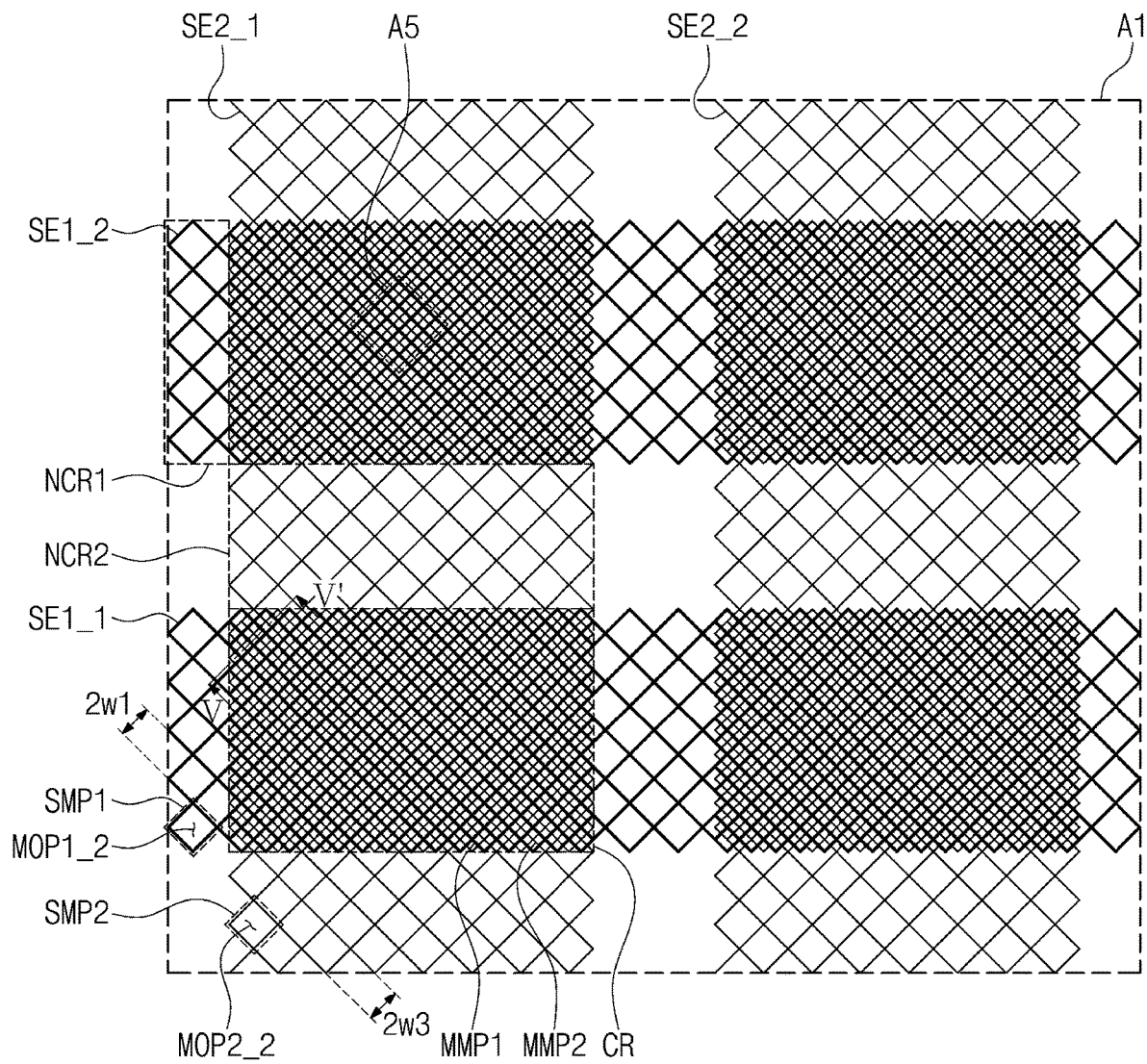
FIG. 11 is an enlarged plan view of an area A1 of FIG. 5 according to some embodiments of the inventive concept.
Figure 12A:
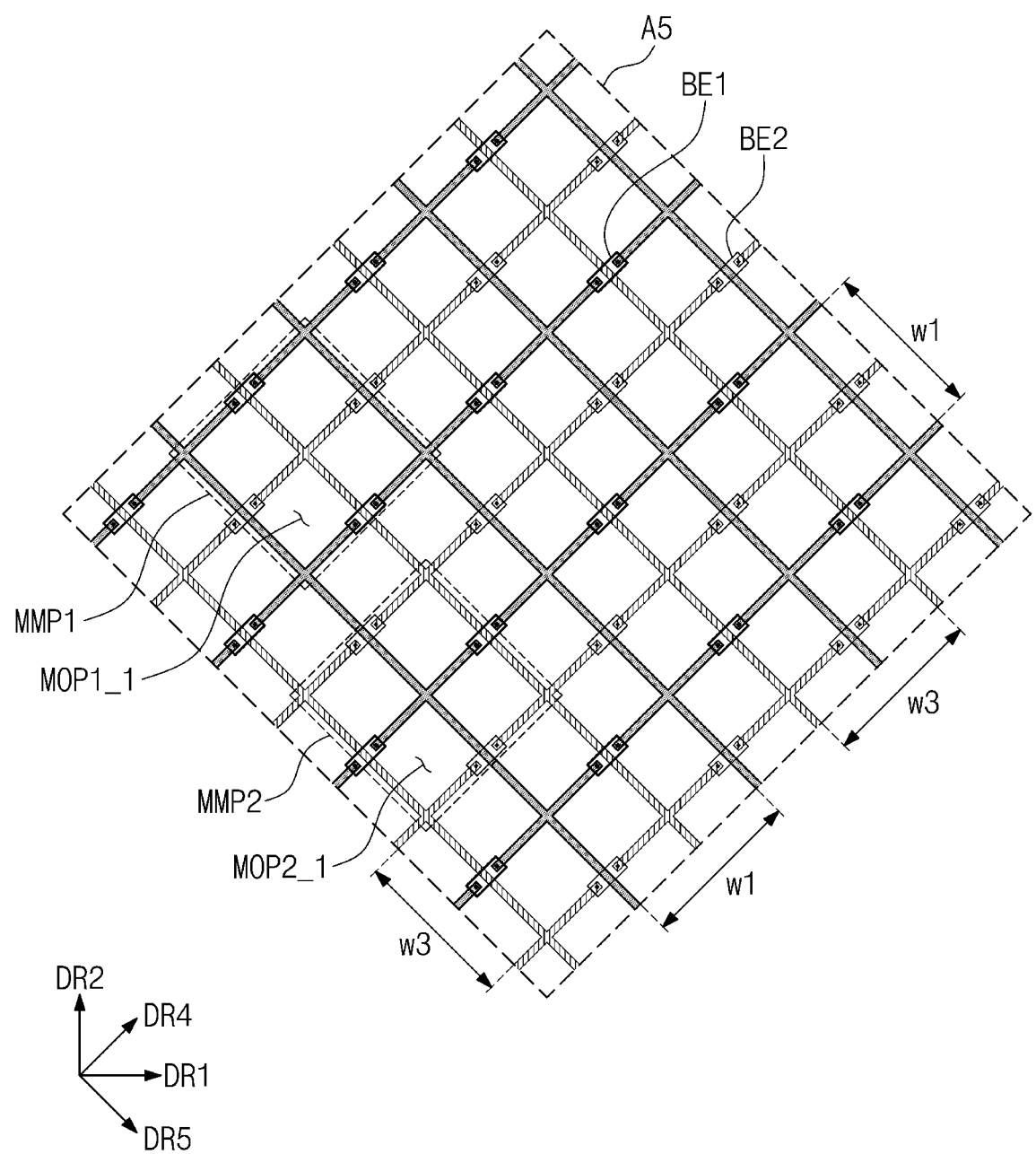
FIGS. 12A and 12B are enlarged plan views of an area A5 of FIG. 11.
Figure 12B:
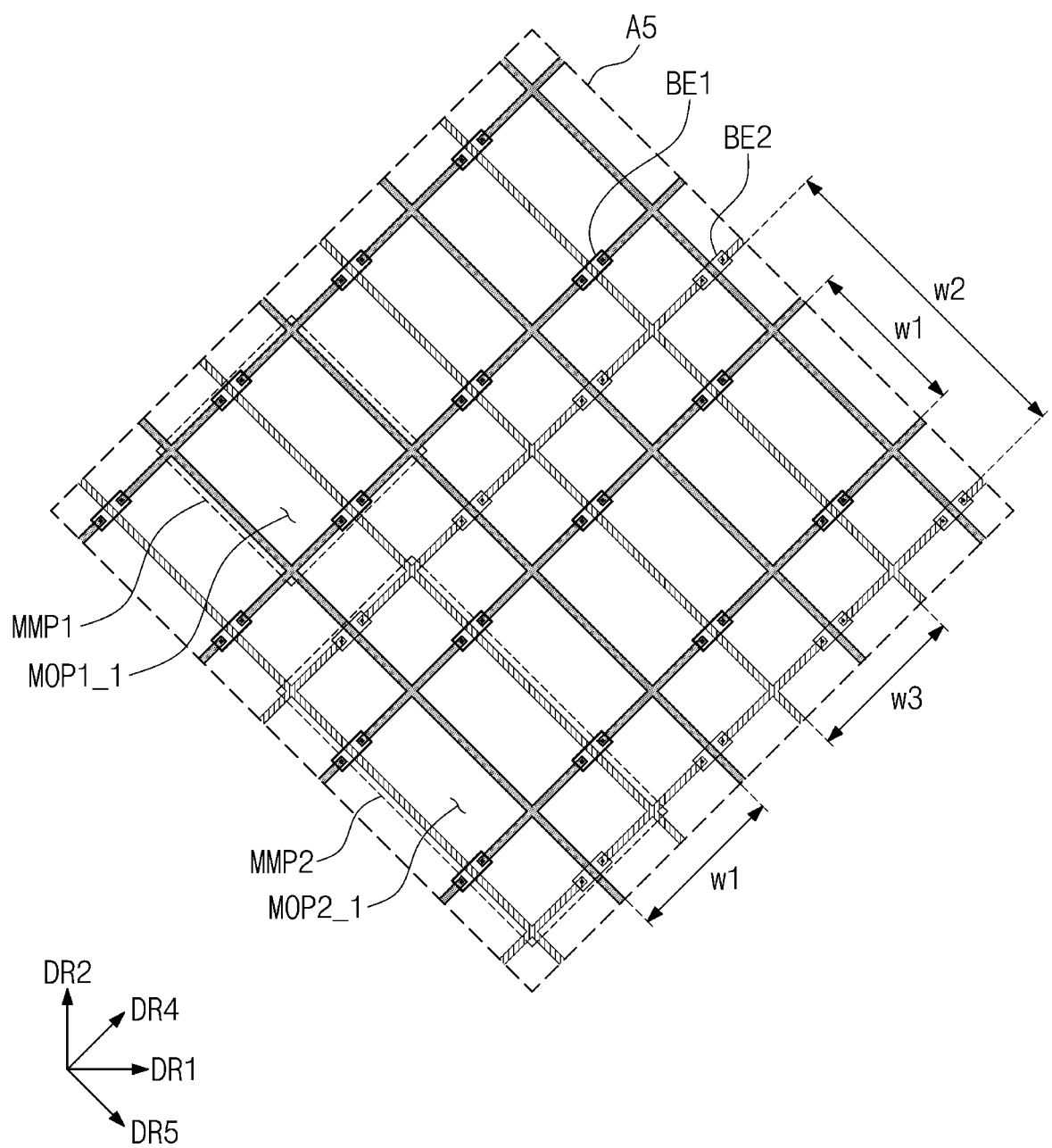

FIG. 11 is an enlarged plan view of the area A1 of FIG. 5 according to an embodiment of the inventive concept. FIGS. 12A and 12B are enlarged plan views of an area A5 of FIG. 11, FIG. 12C is a cross-sectional view taken along the line V-V' of FIG. 11.

Figure 12C:
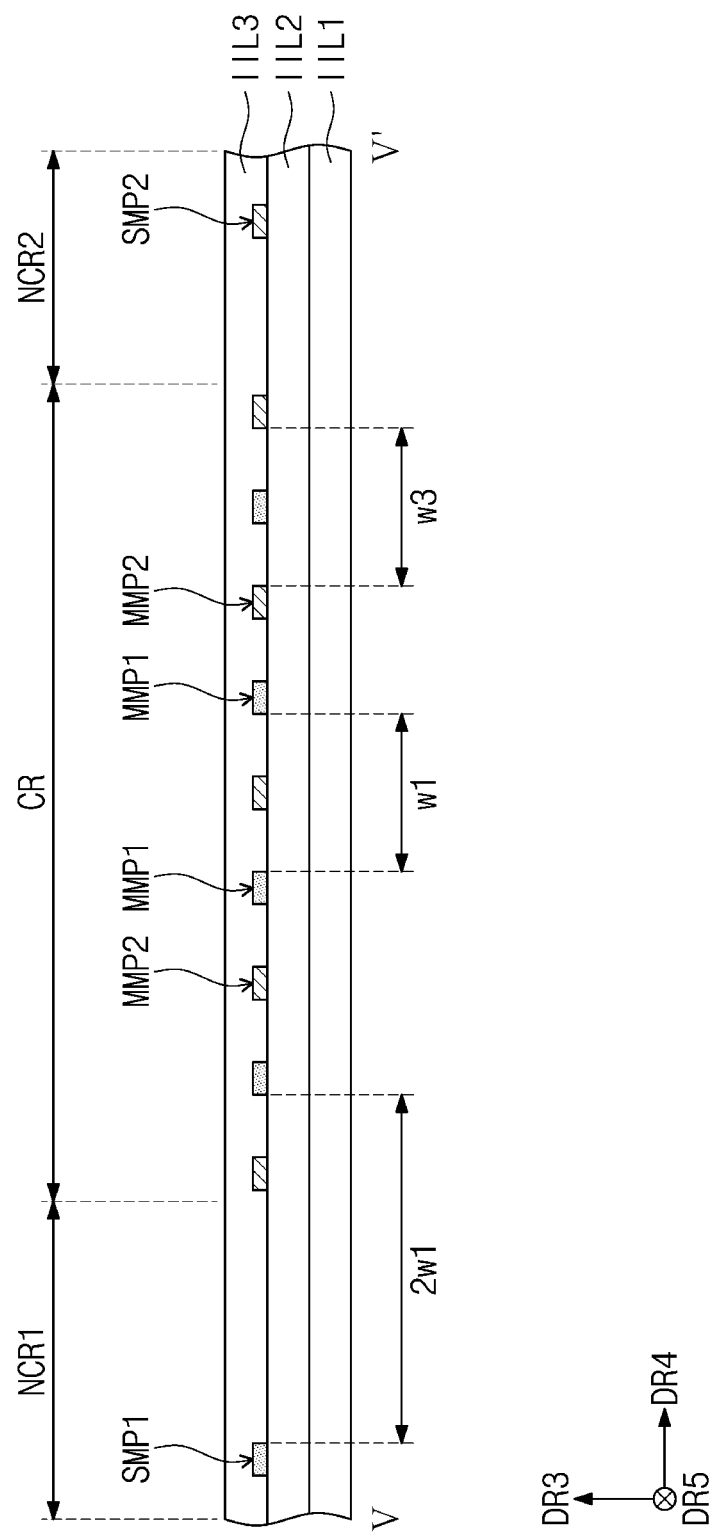
FIG. 12C is a cross-sectional view taken along the line V-V' of FIG. 11.

Referring to FIGS. 11, 12A and 12C, each of the first sensing electrodes SE1_1 and SE1_2 and the second sensing electrodes SE2_1 and SE2_2 may have a mesh structure.

Each of the first sensing electrodes SE1_1 and SE1_2 may include a first main mesh pattern MMP1 located in the crossing area CR and a first sub mesh pattern SMP1 located in the first non-crossing area NCR1.

The first main mesh pattern MMP1 may have a size different from that of the first sub mesh pattern SMP1. According to some embodiments of the inventive concept, the first main mesh pattern MMP1 may have a size less than that of the first sub mesh pattern SMP1, For example, the first main mesh pattern MMP1 may have a size corresponding to about ½ times or about ¼ times of the first sub mesh pattern SMP1.

A first main mesh opening MOP1_1 may be defined in the first main mesh pattern MMP1. The first main mesh opening MOP1_1 may have a first width w1 in the fourth and fifth directions DR4 and DR5. A first sub mesh opening MOP1_2 may be defined in the first sub mesh pattern SMP1. The first sub mesh opening MOP1_2 may have a width greater than the first width w1 in the fourth and fifth directions DR4 and DR5. According to some embodiments of the inventive concept, the first sub mesh opening MOP1_2 may have a size twice or four times greater than that of the first main mesh opening MOP1_1.

Each of the second sensing electrodes SE2_1 and SE2_2 may include a second main mesh pattern MMP2 located in the crossing area CR and a second sub mesh pattern SMP2 located in the second non-crossing area NCR2.

The second main mesh pattern MMP2 may have a size less than that of the second sub mesh pattern SMP2. According to some embodiments of the inventive concept, the second main mesh pattern MMP2 may have a size corresponding to about ½ times or about ¼ times of the second sub mesh pattern SMP2.

A second main mesh opening MOP2_1 may be defined in the second main mesh pattern MMP2. The second main mesh opening MOP2_1 may have a third width w3 in the fourth and fifth directions DR4 and DR5. A second sub mesh opening MOP2_2 may be defined in the second sub mesh pattern SMP2. The second sub mesh opening MOP2_2 may have a width greater than the third width w3 in the fourth and fifth directions DR4 and DR5. According to some embodiments of the inventive concept, the second sub mesh opening MOP2_2 may have a size twice or four times greater than that of the second main mesh opening MOP2_1.

FIG. 12A illustrates a structure in which the first main mesh pattern MMP1 and the second main mesh pattern MMP2 have the same size, but embodiments according to the inventive concept are not limited thereto. Specifically, as illustrated in FIG. 12B, the second main mesh pattern MMP2 may have a size greater than that of the first main mesh pattern MMP1 and less than that of the second sub mesh pattern SMP2. According to some embodiments of the inventive concept, the second main mesh pattern MMP2 may have a size twice greater than that of the first main mesh pattern MMP1 and a size corresponding to about ½ times of the second sub mesh pattern SMP2. FIG. 12B illustrates a structure in which the second main mesh opening MOP2_1 has the third width w3 in the fourth direction DR4 and the second width w2 twice greater than the third width w3 in the fifth direction DR5, but embodiments according to the inventive concept are not limited thereto. For example, the second main mesh opening MOP2_1 may have the second width w2 in the fourth direction DR4 and the third width w3 in the fifth direction DR5.

According to some embodiments of the inventive concept, all of the first sensing electrodes SE1_1 and SE1_2 and the second sensing electrodes SE2_1 and SE2_2 in the crossing area CR may include a main mesh pattern having a size less than that of the sub mesh pattern. Accordingly, at least one first main mesh pattern MMP1 may cross two or more second main mesh patterns MMP2 in the crossing area CR. Thus, the number of crossing parts at which the first main mesh pattern MMP1 and the second main mesh pattern MMP2 cross each other may increase when compared to the structure illustrated in FIG. 8B. As a result, a spaced distance between the first main mesh pattern MMP1 and the second main mesh patterns MMP2 may further increase at a portion thereof, which has a width less than the first width w1. Thus, the distance between the first sensing electrodes SE1_1 and SE1_2 and the second sensing electrodes SE2_1 and SE2_2 may be reduced, and as a result, in the first mode, when the first input TC1 (refer to FIG. 3A) is sensed using the mutual capacitance between the first sensing electrodes SE1_1 and SE1_2 and the second sensing electrodes SE2_1 and SE2_2, sensing sensitivity may be improved.

On the other hand, when the total capacitance of the first sensing electrodes SE1_1 and SE1_2 and the second sensing electrodes SE2_1 and SE2_2 is greater than or equal to a reference value, the sensing sensitivity in the second mode may be deteriorated. According to some embodiments of the inventive concept, the reference value may be about 200 picofarads, but is not particularly limited thereto.

In the second mode, the first and second main mesh patterns MMP1 and MMP2 and the first and second sub mesh patterns SMP1 and SMP2 may be determined in size so that the total capacitance of the first sensing electrodes SE1_1 and SE1_2 and the second sensing electrodes SE2_1 and SE2_2 is maintained below the reference value. That is, the first and second sub mesh patterns SMP1 and SMP2 that do not affect the sensing sensitivity in the first mode may increase in size to improve the sensing sensitivity in the second mode. Also, at least one of the first and second main mesh patterns MMP1 and MMP2 that affect the sensing sensitivity in the first mode may have a size less than that of each of the first and second sub mesh patterns SMP1 and SMP2 to improve the sensing sensitivity in the first mode.

In FIGS. 11 to 12C, the first and second sub mesh patterns SMP1 and SMP2 may have the same size. However, the embodiments according to the inventive concept are not limited thereto. For example, the first and second sub mesh patterns SMP1 and SMP2 may have sizes different from each other.

As illustrated in FIGS. 12A and 12B, the sensing sensitivity in the first mode may be further improved in the embodiment in which each of the first and second main mesh patterns MMP1 and MMP2 has a size less than that of each of the first and second sub mesh patterns SMP1 and SMP2, as illustrated in FIGS. 12A and 12B, when compared to the embodiment in which only the first main mesh pattern MMP1 of the first and second main mesh patterns MMP1 and MMP2 has a size less than that of the first sub mesh pattern SMP1 as illustrated in FIG. 8B. However, in the structure illustrated in FIGS. 12A and 12B, the number of the first and second bridge patterns BE1 and BE2 located in the cross area CR may increase when compared to the structure illustrated in FIG. 8B.

Figure 13:
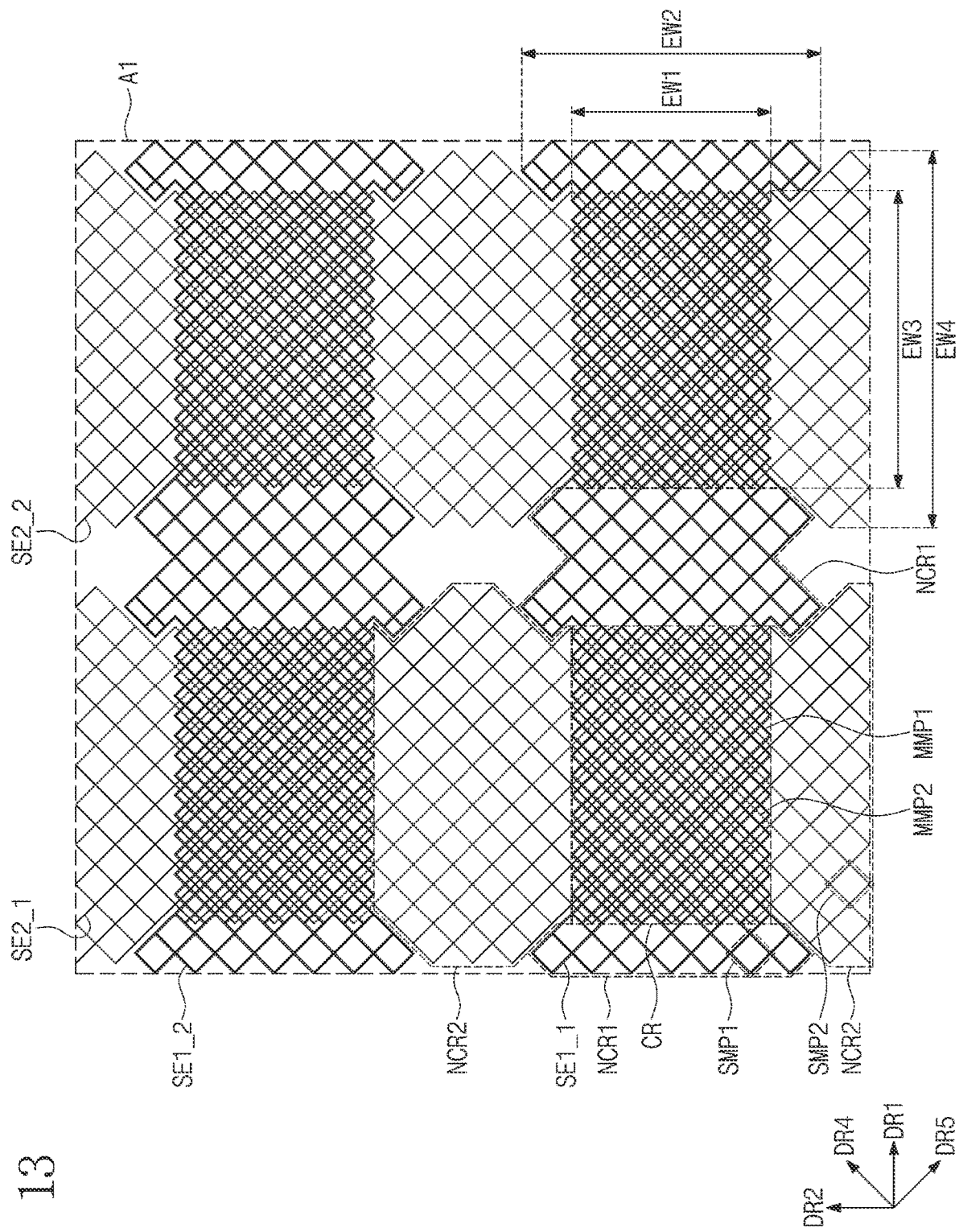
FIG. 13 is an enlarged plan view of the area A1 of FIG. 5 according to some embodiments of the inventive concept.

FIG. 13 is an enlarged plan view of the area A1 of FIG. 5 according to some embodiments of the inventive concept.

Referring to FIG. 13, each of the first sensing electrodes SE1_1 and SE1_2 and the second sensing electrodes SE2_1 and SE2_2 may have a mesh structure.

Each of the first sensing electrodes SE1_1 and SE1_2 may include a first main mesh pattern MMP1 located in the crossing area CR and a first sub mesh pattern SMP1 located in the first non-crossing area NCR1. Each of the first sensing electrodes SE1_1 and SE1_2 has a first electrode width EW1 in the crossing area CR and a second electrode width EW2 different from the first electrode width EW1 in the first non-crossing area NCR1. Here, the first and second electrode widths EW1 and EW2 may be defined as widths in the first direction DR1.

According to some embodiments of the inventive concept, the second electrode width EW2 may be greater than the first electrode width EW1, The second electrode width EW2 of each of the first sensing electrodes SE1_1 and SE1_2 in the first non-crossing area NCR1 may not have one value. That is, the second electrode width EW2 of each of the first sensing electrodes SE1_1 and SE1_2 in the first non-crossing area NCR1 may have a different value according to a distance from the crossing area CR. For example, the second electrode width EW2 of each of the first sensing electrodes SE1_1 and SE1_2 may gradually increase in a first adjacent area in which a distance spaced apart from the crossing area CR is within a first reference distance.

Referring to FIGS. 8B and 13, the first main mesh pattern MMP1 may have a size different from that of the first sub mesh pattern SMP1. According to some embodiments of the inventive concept, the first main mesh pattern MMP1 may have a size less than that of the first sub mesh pattern SMP1. For example, the first main mesh pattern MMP1 may have a size corresponding to about ½ times or about ¼ times of the first sub mesh pattern SMP1.

Each of the second sensing electrodes SE2_1 and SE2_2 may include a second main mesh pattern MMP2 located in the crossing area CR and a second sub mesh pattern SMP2 located in the second non-crossing area NCR2. Each of the second sensing electrodes SE2_1 and SE2_2 may have a third electrode width EW3 in the crossing area CR and a fourth electrode width EW4 different from the third electrode width EW3 in the second non-crossing area NCR2. Here, the third and fourth electrode widths EW3 and EW4 may be defined as widths in the second direction DR2.

According to some embodiments of the inventive concept, the fourth electrode width EW4 may be greater than the third electrode width EW3. However, the fourth electrode width EW4 of each of the second sensing electrodes SE2_1 and SE2_2 in the second non-crossing area NCR2 may not have one value. That is, the fourth electrode width EW4 of each of the second sensing electrodes SE2_1 and SE2_2 in the second non-crossing area NCR2 may have a different value according to a distance spaced apart from the crossing area CR. For example, the fourth electrode width EW4 of each of the second sensing electrodes SE2_1 and SE2_2 may gradually increase in a second adjacent area in which a distance spaced apart from the crossing area CR is within a second reference distance.

The electrode widths EW2 and EW4 of each of the first and second sensing electrodes SE1_1, SE1_2, SE2_1, and SE2_2 in the first and second adjacent areas, which are adjacent to the crossing area CR of the first and second non-crossing areas NCR1 and NCR2 may increase rather than the electrode widths EW1 and EW3. Then, the spaced distance between the first and second sensing electrodes SE1_1, SE1_2, SE2_1, and SE2_2 in the first and second adjacent areas that are adjacent to the crossing area CR may be reduced. Thus, mutual capacitance may be generated between the first and second sensing electrodes SE1_1, SE1_2, SE2_1, and SE2_2 even in the first and second adjacent areas, Thus, the first and second sensing electrodes SE1_1, SE1_2, SE2_1, and SE2_2 may generate the mutual capacitance up to the adjacent area that is adjacent to the crossing area CR to improve the sensing sensitivity in the first mode.

Figure 14A:
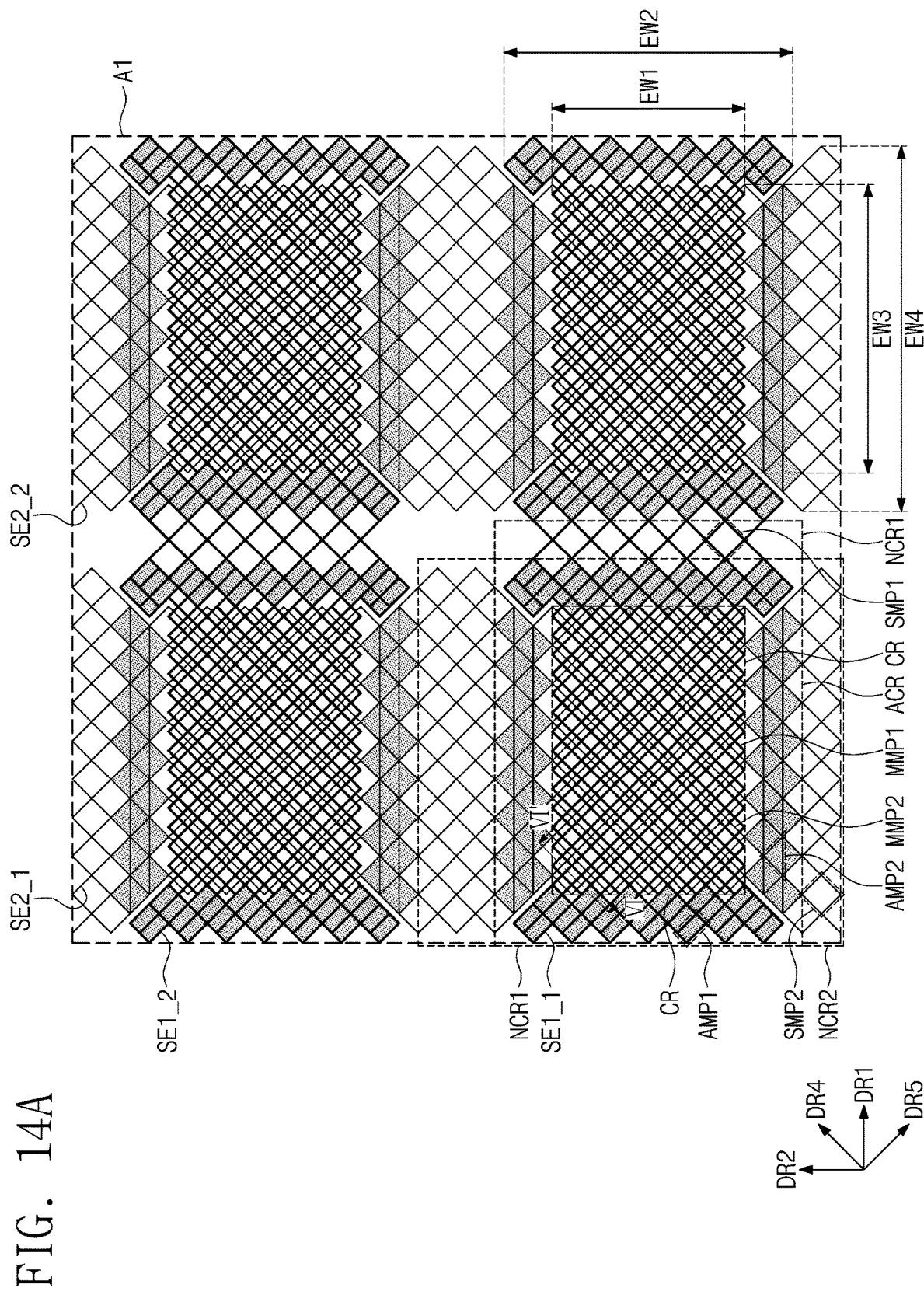
FIG. 14A is an enlarged plan view of the area A1 of FIG. 5 according to some embodiments of the inventive concept.
Figure 14B:
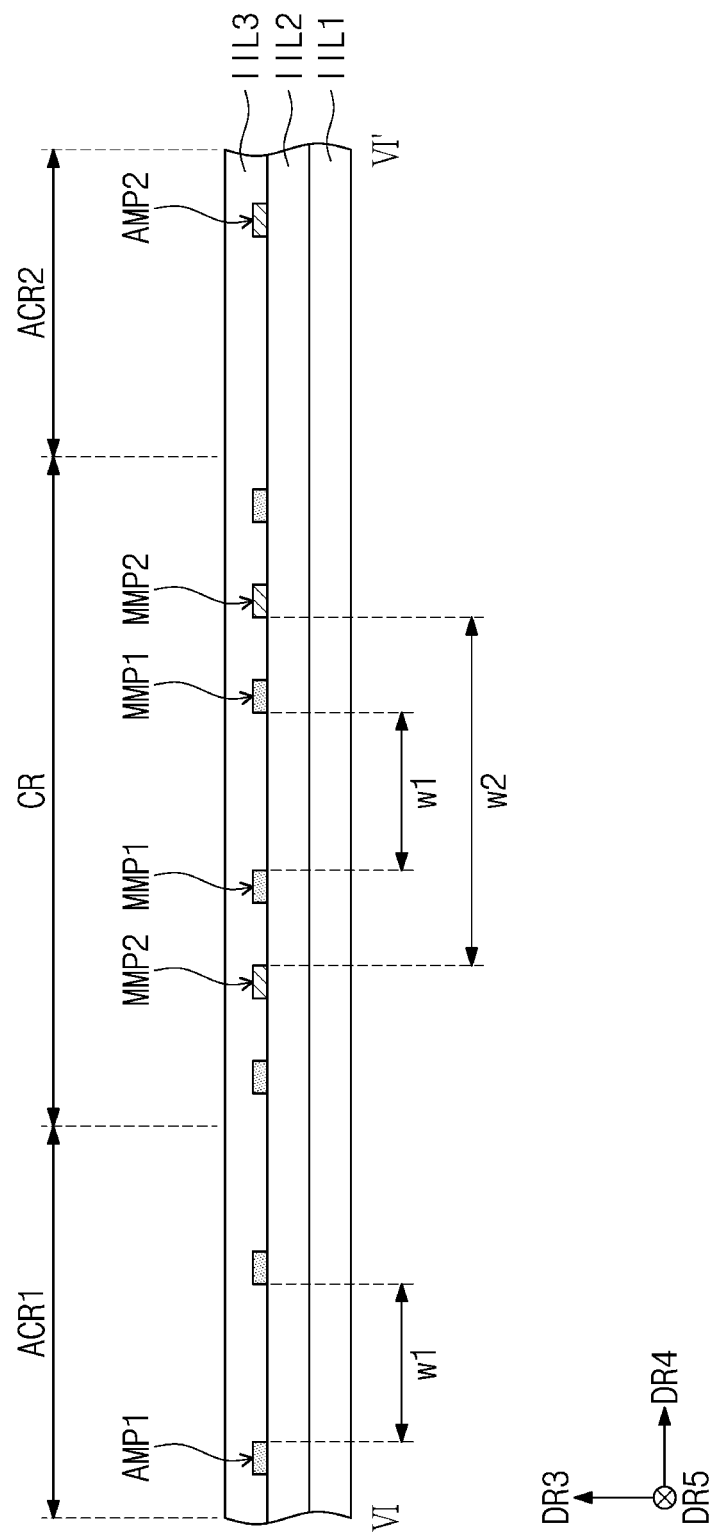
FIG. 14B is a cross-sectional view taken along the line VI-VI' of FIG. 14A.
Figure 15A:
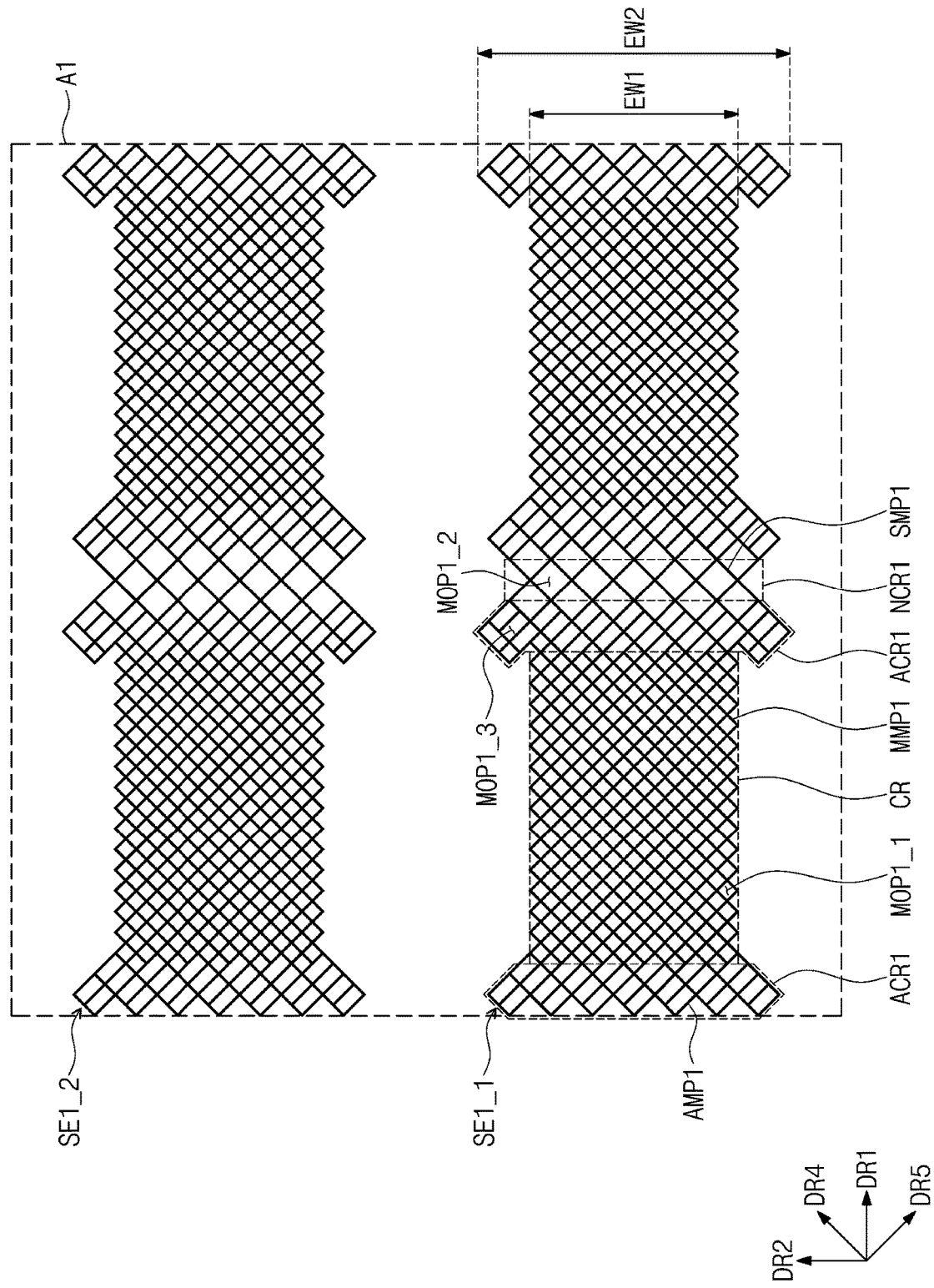
FIG. 15A is an enlarged plan view illustrating first sensing electrodes of FIG. 14A.
Figure 15B:
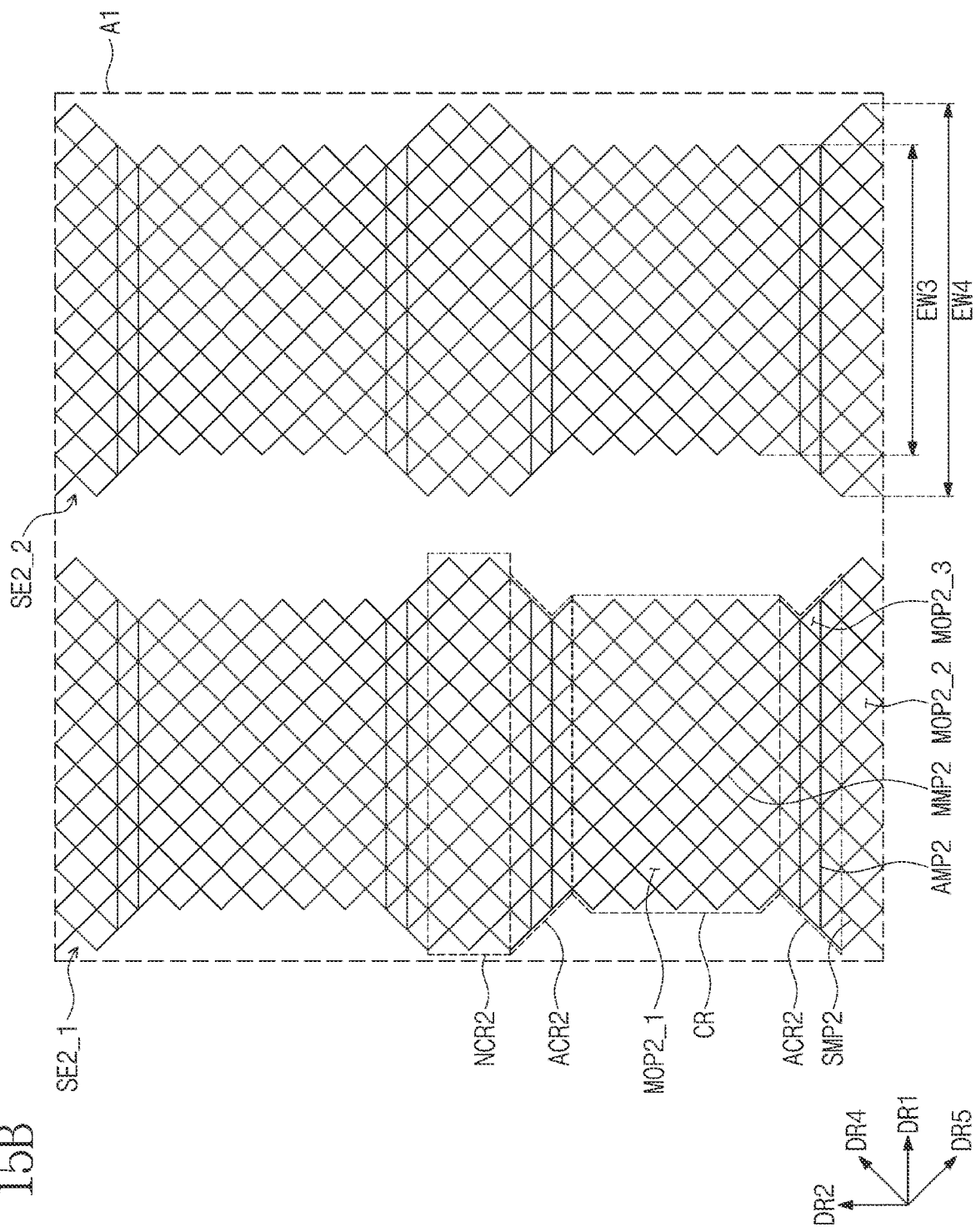
FIG. 15B is an enlarged plan view illustrating second sensing electrodes of FIG. 14A.

FIG. 14A is an enlarged plan view of the area A1 of FIG. 5 according to some embodiments of the inventive concept, and FIG. 14B is a cross-sectional view taken along the line VI-VI' of FIG. 14A. FIG. 15A is an enlarged plan view illustrating first sensing electrodes of FIG. 14A, and FIG. 15B is an enlarged plan view illustrating second sensing electrodes of FIG. 14A.

Referring to FIGS. 14A to 15B, each of the first sensing electrodes SE1_1 and SE1_2 and the second sensing electrodes SE2_1 and SE2_2 may have a mesh structure.

Each of the first sensing electrodes SE1_1 and SE1_2 may include a first main mesh pattern MMP1 located in the crossing area CR and a first sub mesh pattern SMP1 located in the first non-crossing area NCR1. Each of the second sensing electrodes SE2_1 and SE2_2 may include a second main mesh pattern MMP2 located in the crossing area CR and a second sub mesh pattern SMP2 located in the second non-crossing area NCR2. According to some embodiments of the inventive concept, the first main mesh pattern MMP1 may have a size less than that of the first sub mesh pattern SMP1, and the second main mesh pattern MMP2 may have the same size as the second sub mesh pattern SMP2.

An adjacent area ACR may be provided around the crossing area CR. The adjacent area ACR may be provided between the crossing area CR and the first and second non-crossing areas NCR1 and NCR2. The adjacent area ACR includes a first adjacent area ACR1, in which the first sensing electrodes SE1_1 and SE1_2 are located, and a second adjacent area ACR2, in which the second sensing electrodes SE2_1 and SE2_2 are located.

Each of the first sensing electrodes SE1_1 and SE1_2 may further include a first adjacent mesh pattern AMP1 located in the first adjacent area ACR1, and each of the second sensing electrodes SE2_1 and SE2_2 may further include a second adjacent mesh pattern AMP2 located in the second adjacent area ACR2. The first adjacent mesh pattern AMP1 may have a size less than that of the first sub mesh pattern SMP1. The first adjacent mesh pattern AMP1 may have a size greater than or equal to the first main mesh pattern MMP1. According to some embodiments of the inventive concept, the first adjacent mesh pattern AMP1 may have a size twice greater than that of the first main mesh pattern MMP1, and the first sub mesh pattern SMP1 may have a size four times greater than that of the first main mesh pattern MMP1.

The first main mesh opening MOP1_1 provided in the first main mesh pattern MMP1 has a size less than that of the first sub mesh opening MOP1_2 provided in the first sub mesh pattern SMP1. A first adjacent mesh opening MOP1_3 is provided in the first adjacent mesh pattern AMP1. The first adjacent mesh opening MOP1_3 may be less than the first sub mesh opening MOP1_2 and be greater than the first main mesh opening MOP1_1.

The second adjacent mesh pattern AMP2 may have a size less than that of the second sub mesh pattern SMP2. According to some embodiments of the inventive concept, the second adjacent mesh pattern AMP2 may have a size corresponding to about ½ times or about 114 times of the second sub mesh pattern SMP2. FIGS. 14A and 15B illustrate a structure in which the second main mesh pattern MMP2 has the same size as the second sub mesh pattern SMP2, but embodiments according to the inventive concept are not limited thereto. For example, when the second main mesh pattern MMP2 has a size less than that of the second sub mesh pattern SMP2, the second adjacent mesh pattern AMP2 has a size that is equal to or greater than that of the second main mesh pattern MMP2.

The second main mesh opening MOP2_1 provided in the second main mesh pattern MMP2 has the same size as that of the second sub mesh opening MOP2_2 provided in the second sub mesh pattern SMP2. A second adjacent mesh opening MOP2_3 is provided in the second adjacent mesh pattern AMP2. The second adjacent mesh opening MOP2_3 may be less than each of the second sub mesh opening MOP2_2 and the second main mesh opening MOP2_1.

Each of the first sensing electrodes SE1_1 and SE1_2 has a first electrode width EW1 in the crossing area CR and a second electrode width EW2 different from the first electrode width EW1 in the first adjacent area ACR1. Here, the first and second electrode widths EW1 and EW2 may be defined as widths in the first direction DR1. According to some embodiments of the inventive concept, the second electrode width EW2 may be greater than the first electrode width EW1. The second electrode width EW2 of each of the first sensing electrodes SE1_1 and SE1_2 in the first adjacent area ACR1 may have a different value according to a distance spaced apart from the crossing area CR. For example, the second electrode width EW2 of each of the first sensing electrodes SE1_1 and SE1_2 may gradually increase in the first adjacent area ACR1.

Each of the second sensing electrodes SE2_1 and SE2_2 may have a third electrode width EW3 in the crossing area CR and a fourth electrode width EW4 different from the third electrode width EW3 in the second adjacent area ACR2. Here, the third and fourth electrode widths EW3 and EW4 may be defined as widths in the second direction DR2. According to some embodiments of the inventive concept, the fourth electrode width EW4 may be greater than the third electrode width EW3. The fourth electrode width EW4 of each of the second sensing electrodes SE2_1 and SE2_2 in the second adjacent area ACR2 may have a different value according to a distance spaced apart from the crossing area CR. For example, the fourth electrode width EW4 of each of the second sensing electrodes SE2_1 and SE2_2 may gradually increase in the second adjacent area ACR2.

Because the mesh pattern of each of the first and second sensing electrodes SE1_1, SE1_2, SE2_1, and SE2_2 located in the first and second adjacent areas ACR1 and ACR2 is reduced in size, the mutual capacitance between the first and second sensing electrodes SE1_1, SE1_2, SE2_1, and SE2_2 may increase when compared to the embodiment described with reference to FIG. 13. Therefore, when compared to the embodiments illustrated in FIGS. 8A and 13, the sensing sensitivity in the first mode may be further improved.

According to some embodiments of the inventive concept, at least one of the first and second sensing electrodes in the crossing area may include the main mesh pattern having the size less than that of the sub mesh pattern provided in the non-crossing area. Therefore, the distance between the first and second sensing electrodes may be reduced in the crossing area. As a result, the sensing sensitivity in the first mode in which the first input is sensed using the mutual capacitance between the first and second sensing electrodes may be improved.

In addition, the size of the sub mesh pattern provided in the non-crossing area may sufficiently increase to reduce the total capacitance of the first and second sensing electrodes, thereby improving the sensing sensitivity in the second mode.

It will be apparent to those skilled in the art that various modifications and deviations can be made in the inventive concept. Thus, it is intended that the present disclosure covers the modifications and deviations of this invention provided they come within the scope of the appended claims and their equivalents. Hence, the real protective scope of the inventive concept shall be determined by the technical scope of the accompanying claims, and their equivalents.

What is claimed is:

1. An electronic device comprising:
a display panel configured to display an image;
an input sensor on the display panel and comprising a first sensing electrode and a second sensing electrode that is electrically insulated from the first sensing electrode, the input sensor being configured to sense a first input in a first mode and to sense a second input in a second mode; and an input device configured to provide the second input to the input sensor, wherein the first sensing electrode comprises:
a first main mesh pattern in a crossing area in which the first and second sensing electrodes cross each other, wherein the second sensing electrode comprises:
a second main mesh pattern in the crossing area, and wherein at least one of the first or second sensing electrodes comprises:
a sub mesh pattern in a non-crossing area on which the first and second sensing electrodes do not cross each other and which has a size different from that of the first and second main mesh patterns, wherein the first and second sensing electrodes are on a same layer, wherein the first sensing electrode further comprises first connection openings defined by opening the first main mesh pattern, wherein the second main mesh pattern passes through the first connection openings, wherein the second sensing electrode is provided with second connection openings defined by opening the second main mesh pattern, and wherein the first main mesh pattern passes through the second connection openings.

2. The electronic device of claim 1, wherein the first sensing electrode further comprises:
a first sub mesh pattern in a first non-crossing area in which the first sensing electrode does not cross the second sensing electrode, and the second sensing electrode further comprises:
a second sub mesh pattern in a second non-crossing area in which the second sensing electrode does not cross the first sensing electrode.

3. The electronic device of claim 2, wherein the first main mesh pattern has a size different from that of the first sub mesh pattern, and
the second main mesh pattern has the same size as the second sub mesh pattern.

4. The electronic device of claim 3, wherein the first main mesh pattern has a size less than that of the first sub mesh pattern.

5. The electronic device of claim 3, wherein the first and second sub mesh patterns have a same size, and
the first main mesh pattern has a size less than that of the second main mesh pattern.

6. The electronic device of claim 2, wherein the first main mesh pattern has a size different from that of the first sub mesh pattern, and
the second main mesh pattern has a size different from that of the second sub mesh pattern.

7. The electronic device of claim 6, wherein the first main mesh pattern has a size less than that of the first sub mesh pattern, and
the second main mesh pattern has a size less than that of the second sub mesh pattern.

8. The electronic device of claim 7, wherein the first and second sub mesh patterns have the same size, and
the first main mesh pattern has a size equal to or less than that of the second main mesh pattern.

9. The electronic device of claim 2, wherein
the first and second sensing electrodes are electrically insulated from each other in the crossing area.

10. The electronic device of claim 9, wherein the first sensing electrode further comprises a first bridge electrode provided in the first connection openings so as to be electrically connected to the first main mesh pattern, and the second sensing electrode further comprises a second bridge electrode provided in the second connection openings so as to be electrically connected to the second main mesh pattern.

11. The electronic device of claim 2, wherein the first sensing electrode has a bar shape extending in a first direction, and
the second sensing electrode has a bar shape extending in a second direction crossing the first direction.

12. The electronic device of claim 11, wherein the first sensing electrode has a width that is constantly maintained in the first direction, and
the second sensing electrode has a width that is constantly maintained in the second direction.

13. The electronic device of claim 11, wherein the first sensing electrode has a first electrode width in the crossing area and a second electrode width, which is greater than the first electrode width, in the first non-crossing area, and
the second sensing electrode has a third electrode width in the crossing area and a fourth electrode width, which is greater than the third electrode width, in the second non-crossing area.

14. The electronic device of claim 2, wherein the first sensing electrode further comprises a first adjacent mesh pattern in a first adjacent area that is adjacent to the crossing area and having a size different from that of each of the first main mesh pattern and the first sub mesh pattern.

15. The electronic device of claim 14, wherein the first adjacent mesh pattern has a size that is less than that of the first sub mesh pattern and greater than that of the first main mesh pattern.

16. The electronic device of claim 14, wherein the second sensing electrode further comprises a second adjacent mesh pattern in a second adjacent area that is adjacent to the crossing area and having a size different from that of each of the second main mesh pattern and the second sub mesh pattern.

17. The electronic device of claim 16, wherein the second main mesh pattern and the second sub mesh pattern have the same size, and
the second adjacent mesh pattern has a size less than that of the second sub mesh pattern.

18. The electronic device of claim 1, wherein the first input comprises an input generated by contact of a user's finger, and
the second input comprises an input generated by contact of the input device.

19. The electronic device of claim 18, wherein the input device comprises an active pen.

20. An electronic device comprising:
a display panel configured to display an image; and
an input sensor on the display panel and comprising a first sensing electrode and a second sensing electrode that is electrically insulated from the first sensing electrode, the input sensor being configured to sense a first input in a first mode and to sense a second input in a second mode, wherein the first sensing electrode comprises:
a first main mesh pattern in a crossing area; and
a first sub mesh pattern in a first non-crossing area in which the first sensing electrode does not cross the second sensing electrode, and the second sensing electrode comprises:
a second main mesh pattern in the crossing area; and
a second sub mesh pattern in a second non-crossing area in which the second sensing electrode does not cross the first sensing electrode, and wherein the first main mesh pattern has a size different from that of the second main mesh pattern, wherein the first and second sensing electrodes are on a same layer, wherein the first sensing electrode further comprises first connection openings defined by opening the first main mesh pattern, wherein the second main mesh pattern passes through the first connection openings, wherein the second sensing electrode is provided with second connection openings defined by opening the second main mesh pattern, and wherein the first main mesh pattern passes through the second connection openings.

21. The electronic device of claim 20, wherein the first main mesh pattern has a size less than that of the second main mesh pattern.

22. The electronic device of claim 21, wherein the first and second sub mesh patterns have the same size, and
the first main mesh pattern has a size less than that of the first sub mesh pattern.

23. The electronic device of claim 20, wherein the first sensing electrode has a bar shape extending in a first direction, and
the second sensing electrode has a bar shape extending in a second direction crossing the first direction.

24. The electronic device of claim 20, wherein, and
the first and second sensing electrodes are electrically insulated from each other in the crossing area.

25. The electronic device of claim 24, wherein the crossing area has a size greater than that of the non-crossing area.

26. The electronic device of claim 20, wherein the crossing area has a size greater than that of at least one of the first non-crossing area and the second non-crossing area.

* * * * *